(12) United States Patent
Fukumasu et al.

(10) Patent No.: US 9,345,150 B2
(45) Date of Patent: May 17, 2016

(54) ELECTRICAL CONVERTER

(75) Inventors: Keisuke Fukumasu, Hitachinaka (JP); Makoto Torigoe, Ayase (JP); Kenichiro Nakajima, Hitachinaka (JP); Masayoshi Takahashi, Yokohama (JP); Hiroki Funato, Fujisawa (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 432 days.

(21) Appl. No.: 13/976,144

(22) PCT Filed: Nov. 25, 2011

(86) PCT No.: PCT/JP2011/006553
§ 371 (c)(1),
(2), (4) Date: Jul. 23, 2013

(87) PCT Pub. No.: WO2012/090381
PCT Pub. Date: Jul. 5, 2012

(65) Prior Publication Data
US 2013/0294040 A1    Nov. 7, 2013

(30) Foreign Application Priority Data

Dec. 27, 2010    (JP) .................................. 2010-289123

(51) Int. Cl.
| | |
|---|---|
| *H05K 5/00* | (2006.01) |
| *H02M 7/00* | (2006.01) |
| *H02M 1/44* | (2007.01) |
| *B60L 1/00* | (2006.01) |
| *B60L 3/00* | (2006.01) |
| *B60L 11/12* | (2006.01) |
| *B60L 11/14* | (2006.01) |
| *B60L 15/20* | (2006.01) |
| *H05K 7/14* | (2006.01) |

(52) U.S. Cl.
CPC .............. *H05K 5/0026* (2013.01); *B60L 1/003* (2013.01); *B60L 3/003* (2013.01); *B60L 11/123* (2013.01);

(Continued)

(58) Field of Classification Search
CPC .............................. H02M 7/003; H05K 5/0026
See application file for complete search history.

(56) References Cited

U.S. PATENT DOCUMENTS

| | | | | |
|---|---|---|---|---|
| 6,898,072 | B2 * | 5/2005 | Beihoff | B60L 11/12 257/692 |
| 7,032,695 | B2 * | 4/2006 | Beihoff | B60L 11/12 180/65.1 |

(Continued)

FOREIGN PATENT DOCUMENTS

| | | |
|---|---|---|
| JP | 56-170884 U | 12/1981 |
| JP | 4-16452 U | 2/1992 |

(Continued)

OTHER PUBLICATIONS

International Search Report dated Feb. 28, 2012 with English translation (Four (4) pages).

*Primary Examiner* — Adrian S Wilson
(74) *Attorney, Agent, or Firm* — Crowell & Moring LLP

(57) ABSTRACT

Radiated noise caused by switching noise of power semiconductor elements in an electrical converter is reduced. The electrical converter is characterized in comprising: a case; a power module mounted on the case and comprising a plurality of power semiconductor elements; a metal plate mounted to the power module and fixed to the case; a control circuit board arranged on the metal plate, for controlling the power semiconductor elements; and a direct-current input terminal electrically connected to a battery. The electrical converter is also characterized in being provided at the bottom with a transmission or motor, and at the top with a connector for connecting the battery and the direct-current input terminal. The electrical converter is further characterized in that the metal plate is curved, and a portion of the curved metal plate is arranged in the space between the control circuit board and the direct-current input terminal.

7 Claims, 22 Drawing Sheets

(52) U.S. Cl.
CPC ............... B60L 11/14 (2013.01); B60L 15/20 (2013.01); H02M 1/44 (2013.01); H02M 7/003 (2013.01); H05K 7/1432 (2013.01); *B60L 2200/10* (2013.01); *B60L 2200/26* (2013.01); *B60L 2200/32* (2013.01); *B60L 2200/36* (2013.01); *B60L 2210/40* (2013.01); *B60L 2240/36* (2013.01); *B60L 2240/423* (2013.01); *Y02T 10/6217* (2013.01); *Y02T 10/645* (2013.01); *Y02T 10/7005* (2013.01); *Y02T 10/7077* (2013.01); *Y02T 10/7241* (2013.01); *Y02T 10/7275* (2013.01)

(56) References Cited

U.S. PATENT DOCUMENTS

| | | | |
|---|---|---|---|
| 7,561,429 B2 | 7/2009 | Yahata et al. | |
| 2008/0116838 A1* | 5/2008 | Hattori | B60H 1/3223 318/722 |
| 2008/0130223 A1* | 6/2008 | Nakamura | H02M 7/003 361/689 |
| 2010/0155158 A1* | 6/2010 | Azuma | B60K 6/48 180/65.8 |
| 2010/0188814 A1* | 7/2010 | Nakatsu | H02M 7/003 361/689 |
| 2011/0211980 A1 | 9/2011 | Shibuya et al. | |
| 2013/0021749 A1* | 1/2013 | Nakajima | H02M 7/003 361/689 |

FOREIGN PATENT DOCUMENTS

| | | |
|---|---|---|
| JP | 2000-102221 A | 4/2000 |
| JP | 2006-27315 A | 2/2006 |
| JP | 2008-125240 A | 5/2008 |
| JP | 2008-271701 A | 11/2008 |
| JP | 2008-301544 A | 12/2008 |
| JP | 2010-112261 A | 5/2011 |

* cited by examiner (a)　　　　　　　　　(b)

(a)　　　　　　　　　(b)

(a)　　　　　　　　　(b)

(a) WITH SHIELDS (b) WITHOUT SHIELDS

ELECTRICAL CONVERTER

TECHNICAL FIELD

The present invention relates to an electrical converter.

BACKGROUND ART

An electrical converter such as an inverter that generates alternating-current power from direct-current power of a battery or the like includes: a main circuit including switching elements; a drive circuit that drives the switching elements; a smoothing capacitor; and a control circuit that generates an operating signal to be transmitted to the drive circuit or the like.

When the switching elements switch a direct-current power supply fast, surge current and voltage are generated along with rapid change in the voltage and current, and this causes electromagnetic noise. In general, to prevent the influence of the switching noise of power semiconductor elements, a shielding member is disposed between a bus bar as a noise source and a control circuit board. An example of a structure for solving such as problem includes Patent Literature 1 (JP-A-2008-125240) providing "a power converter unit comprising: a metal casing; a power module mounted in the metal casing and equipped with a plurality of power semiconductor devices; a metal plate mounted on the power module and fixed to the metal casing; a heat dissipating sheet disposed on the metal plate; and a drive circuit board which controls the power semiconductor devices and is disposed on the heat dissipating sheet".

CITATION LIST

Patent Literature

Patent Literature 1: JP-A-2008-125240

SUMMARY OF INVENTION

Technical Problem

According to the power converter disclosed in Patent Literature 1, part of the metal plate is bent, and the part is positioned between the bus bar that supplies power and the drive circuit board. This configuration can prevent malfunction of the drive circuit board. However, electromagnetic coupling between the control circuit board and the bus bar cannot be prevented, so that there is a problem that the electromagnetic coupling between the bus bar and the control circuit board propagates electromagnetic noise to the control circuit board and increases electromagnetic radiation to the outside.

To miniaturize vehicle parts or to shorten an AC cable for connecting an electrical converter and a motor, there is a tendency to incorporate the electrical converter into a transmission or a motor, which have been contained in different housings so far, to form one module. FIG. 25 is a diagram for describing an installation location of the electrical converter according to the present embodiment.

An open section of a case connected to a DC cable wired from the outside of the module is attached at the top of the electrical converter in order to improve assembly workability of the vehicle. Accordingly, in the electrical converter where the power module, the drive circuit board, the metal plate, and the control circuit board are sequentially laminated and mounted from the bottom surface, the bus bar is mounted close to, to, and perpendicularly across the control circuit, so that there is a problem that the electromagnetic coupling between the bus bar and the control circuit propagates noise to the control circuit board and increases the electromagnetic radiation to the outside.

The present invention solves the above problem. Provided is an electrical converter with an inexpensive and small structure for reducing noise current or voltage entering the converter by propagating through control wiring connected to an external device.

Solution to Problem

The following is simple description of a summary of a representative invention of the inventions disclosed in the present specification.

(1) An electrical converter including: a case; a power module mounted on the case and including a plurality of power semiconductor elements; a metal plate mounted to the power module and fixed to the case; a control circuit board arranged on the metal plate, for controlling the power semiconductor elements; and direct-current input terminals electrically connected to a battery, wherein a transmission or a motor is provided at a bottom, a connector for connecting the battery and the direct-current input terminals is provided at a top, the metal plate is curved, and a portion of the curved metal plate is arranged in a space between the control circuit board and the direct-current input terminals.

Advantageous Effects of Invention

The present invention can provide an inexpensive and small electrical converter that reduces radiated noise caused by the switching noise of the power semiconductor elements.

DESCRIPTION OF EMBODIMENTS

An electrical converter 200 according to the present embodiment can be applied to a hybrid car or a pure electric car. A control configuration and a circuit configuration when the electrical converter 200 is applied to a hybrid car will be described as a representative example with reference to FIGS. 1 and 2.

Figure 1:
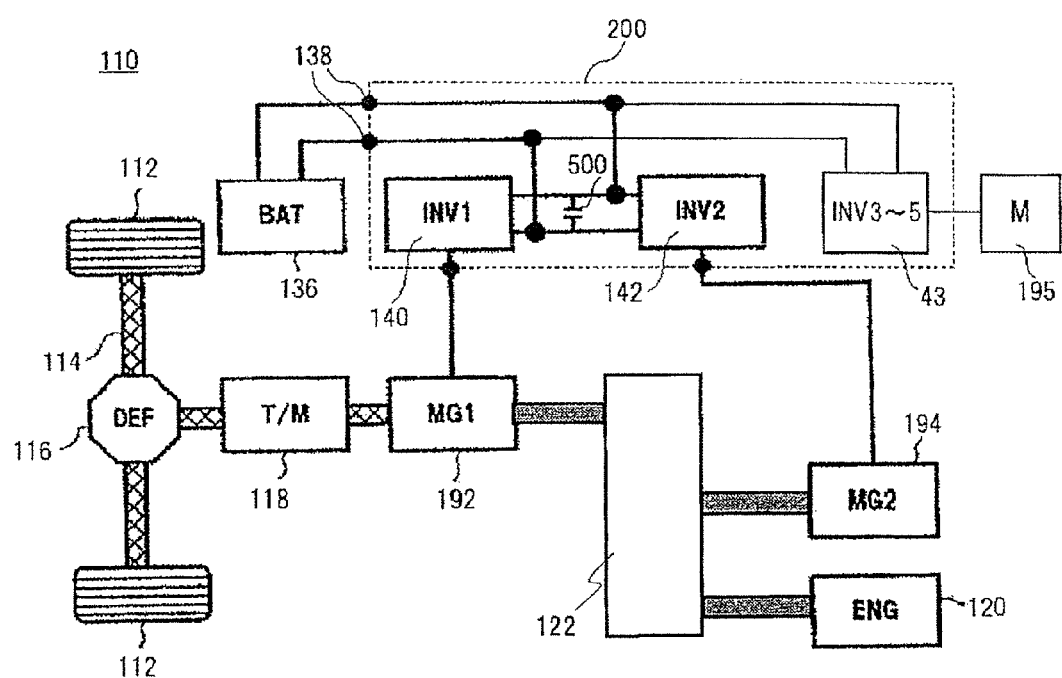
FIG. 1 is a diagram showing control blocks of a hybrid car.

FIG. 1 is a diagram showing control blocks of the hybrid car.

In the electrical converter according to the present embodiment, an example of a vehicle driving inverter apparatus used in a vehicle driving electric system in significantly harsh mounting environment and operational environment will be described. Although the configuration of the present embodiment is optimal for the vehicle driving electrical converter of a car, a truck, or the like, the configuration can also be applied to other electrical converters, such as electrical converters of trains, ships, and airplanes, industrial electrical converters used as control apparatuses of electric motors that drive equipment of factories, and household electrical converters used for control apparatuses of electric motors that drive household solar power generation systems and household electrical appliances.

In FIG. 1, a hybrid electric car (hereinafter, described as "HEV") 110 includes one electrical vehicle and two vehicle drive systems. One of the systems is an engine system including an engine 120, which is an internal combustion engine, as a power source. The engine system is mainly used as a drive source of the HEV. The other is an on-board electric system including motor generators 192 and 194 as power sources. The on-board electric system is mainly used as a drive source of the HEV and as an electric power source of the HEV. The motor generators 192 and 194 are synchronous machines or induction machines, for example. The motor generators 192 and 194 operate as motors and power generators depending on the operating method. Therefore, the motor generators 192 and 194 will be written as motor generators.

A front wheel axle 114 is rotatably supported at a front section of a car body, and a pair of front wheels 112 are arranged on both ends of the front wheel axle 114. A rear wheel axle is rotatably supported at a rear section of the car body, and a pair of rear wheels are arranged on both ends of the rear wheel axle (not shown). Although so-called front wheel drive system is adopted in the HEV of the present embodiment, the opposite, or so-called rear wheel drive system, may also be adopted. A front wheel-side differential gear (hereinafter, described as "front wheel-side DEF") 116 is arranged at a center section of the front wheel axle 114. An output axis of a transmission 118 is mechanically connected to an input side of the front wheel-side DEF 116. An output side of a motor generator 192 is mechanically connected to an input side of the transmission 118. An output side of the engine 120 and an output side of the motor generator 194 are mechanically connected to an input side of the motor generator 192 through a power transfer mechanism 122.

Inverter units 140 and 142 are electrically connected to a battery 136 through a direct-current connector 138. Electric power can be mutually transferred between the battery 136 and the inverter units 140 and 142. The present embodiment provides a first electric drive power generation unit including the motor generator 192 and the inverter unit 140 and a second electric drive power generation unit including the motor generator 194 and the inverter unit 142. The units are selectively used according to the operating state. In the present embodiment, the electric power of the battery 136 can operate the first electric drive power generation unit as an electric drive unit, and the vehicle can be driven only by the power of the motor generator 192. In the present embodiment, power can be generated by operating the first electric drive power generation unit or the second electric drive power generation unit as a power generation unit based on the power of the engine 120 or the power from the wheels, and the battery 136 can be charged.

The battery 136 is also used as a power supply for driving an auxiliary machine motor 195. Examples of the auxiliary machine include a motor for driving a compressor of an air conditioner and a motor for driving a control hydraulic pump. The battery 136 supplies direct-current power to an inverter unit 43, and the inverter unit 43 converts the power to alternating-current power and supplies the power to the motor 195. The inverter unit 43 has functions similar to the inverter units 140 and 142 and controls the phase and the frequency of the alternating current as well as the electric power supplied to the motor 195. Since the capacity of the motor 195 is smaller than the capacities of the motor generators 192 and 194, the maximum converted power of the inverter unit 43 is smaller than that of the inverter units 140 and 142. However, the circuit configuration of the inverter unit 43 is basically the same as the circuit configurations of the inverter units 140 and 142. The electrical converter 200 includes a capacitor module 500 that smoothes a direct current supplied to the inverter unit 140, the inverter unit 142, and the inverter unit 43.

Figure 2:
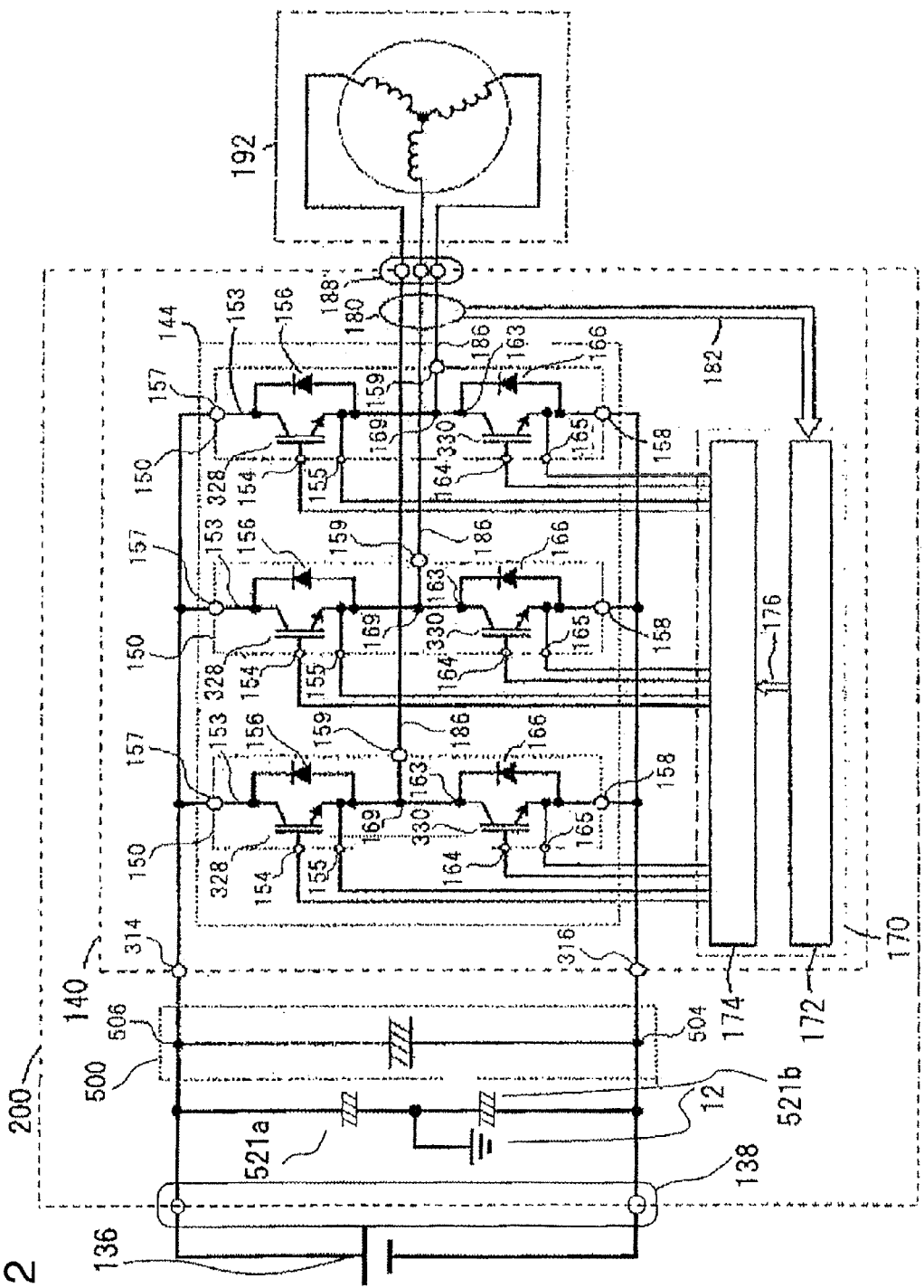
FIG. 2 is a diagram describing an electric circuit configuration of an inverter unit.

The electric circuit configuration of the inverter unit 140, the inverter unit 142, or the inverter unit 43 will be described with reference to FIG. 2. In FIG. 2, the inverter unit 140 will be described as a representative example.

An inverter circuit 144 is provided with an upper and lower arms series circuit 150 including: an IGBT 328 (insulated gate bipolar transistor) and a diode 156 that operate as an upper arm; and an IGBT 330 and a diode 166 that operate as a lower arm, for each of three phases (U phase, V phase, and W phase) corresponding to each phase winding of armature winding of the motor generator 192. Each upper and lower arms series circuit 150 is connected to an alternating-current power line (alternating-current bus bar) 186 to the motor generator 192, from a midpoint section (intermediate electrode 169) through an alternating-current terminal 159 and an alternating-current connector 188.

A collector electrode 153 of the IGBT 328 of the upper arm is electrically connected to an electrode of a capacitor on the positive electrode side of the capacitor module 500 through a positive electrode terminal (P terminal) 157, and an emitter electrode of the IGBT 330 of the lower arm is electrically connected to a capacitor electrode on the negative electrode side of the capacitor module 500 through a negative electrode terminal (N terminal) 158. Bypass capacitors 521*a* and 521*b* are electrically connected between the positive electrode terminal (P terminal) 157 and a cooling jacket 12 and between the negative electrode terminal (N terminal) 158 and the cooling jacket 12.

A control unit 170 includes a driver circuit 174 that drives and controls the inverter circuit 144, and a control circuit 172 that supplies a control signal to the driver circuit 174 through a signal line 176. The IGBT 328 and the IGBT 330 operate by receiving drive signals output from the control unit 170 and converts the direct-current power supplied from the battery 136 to three-phase alternating-current power. This converted power is supplied to the armature winding of the motor generator 192.

The IGBT 328 includes the collector electrode 153, a signal emitter electrode 155, and a gate electrode 154. The IGBT 330 includes a collector electrode 163, a signal emitter electrode 165, and a gate electrode 164. The diode 156 is electrically connected between the collector electrode 153 and the emitter electrode. The diode 166 is electrically connected between the collector electrode 163 and the emitter electrode. A MOSFET (meta-oxide semiconductor field-effect transistor) may be used as a switching power semiconductor element, and in this case, the diode 156 and the diode 166 are not necessary. The capacitor module 500 is electrically connected to a positive electrode-side capacitor terminal 506 and a negative electrode-side capacitor terminal 504 through the direct-current connector 138. The inverter unit 140 is connected to the positive electrode-side capacitor terminal 506 through a direct-current positive electrode terminal 314 and is connected to the negative electrode-side capacitor terminal 504 through a direct-current negative electrode terminal 316.

The control circuit 172 includes a microcomputer that calculates switching timings of the IGBT 328 and the IGBT 330. Information input to the microcomputer includes a target torque value required for the motor generator 192, a current value supplied from the upper and lower arms series circuit 150 to the armature winding of the motor generator 192, and a magnetic pole position of a rotor of the motor generator 192. The target torque value is based on a command signal output from a higher control apparatus not shown. The current value is detected based on a detection signal output from a current sensor 180 through a signal line 182. The magnetic pole position is detected based on a detection signal output from a rotating magnetic pole sensor (not shown) arranged on the motor generator 192. Although an example of detecting current values of three phases will be described in the present embodiment, current values of two phases may be detected.

The microcomputer in the control circuit 172 calculates current command values of d and q axes of the motor generator 192 based on the target torque value and calculates voltage command values of the d and q axes based on a difference between the calculated current command values of the d and q axes and detected current values of the d and q axes. The microcomputer converts the calculated voltage command values of the d and q axes to voltage command values of the U phase, the V phase, and the W phase based on the detected magnetic pole position. The microcomputer generates a pulsed modulation wave based on comparison of a fundamental wave (sine wave) and a carrier wave (triangular wave) based on the voltage command values of the U phase, the V phase, and the W phase and outputs the generated modulation wave as a PWM (pulse width modulation) signal to the driver circuit 174 through the signal line 176.

To drive the lower arm, the driver circuit 174 outputs a drive signal derived by amplifying the PWM signal to the gate electrode of the IGBT 330 of the corresponding lower arm. To drive the upper arm, the driver circuit 174 shifts the level of the reference potential of the PWM signal to the level of the reference potential of the upper arm to amplify the PWM signal and outputs the signal as a drive signal to the gate electrode of the IGBT 328 of the corresponding upper arm.

The control unit 170 detects abnormality (such as over-current, over-voltage, and over-temperature) to protect the upper and lower arms series circuit 150. Accordingly, sensing information is input to the control unit 170. For example, from the signal emitter electrode 155 and the signal emitter electrode 165 of each arm, information of currents flowing through the emitter electrodes of the IGBT 328 and the IGBT 330 is input to corresponding drive units (ICs). In this way, each drive unit (IC) detects over-current. If the over-current is detected, the switching operation of the corresponding IGBT 328 or IGBT 330 is terminated to protect the corresponding IGBT 328 or IGBT 328330 from the over-current. From a temperature sensor (not shown) arranged on the upper and lower arms series circuit 150, information of the temperature of the upper and lower arms series circuit 150 is input to the microcomputer. Information of the voltage of the direct-current positive electrode side of the upper and lower arms series circuit 150 is also input to the microcomputer. The microcomputer detects over-temperature and over-voltage based on the information. If the over-temperature or the over-voltage is detected, the microcomputer terminates the switching operation of all IGBTs 328 and IGBTs 330.

Figure 3:
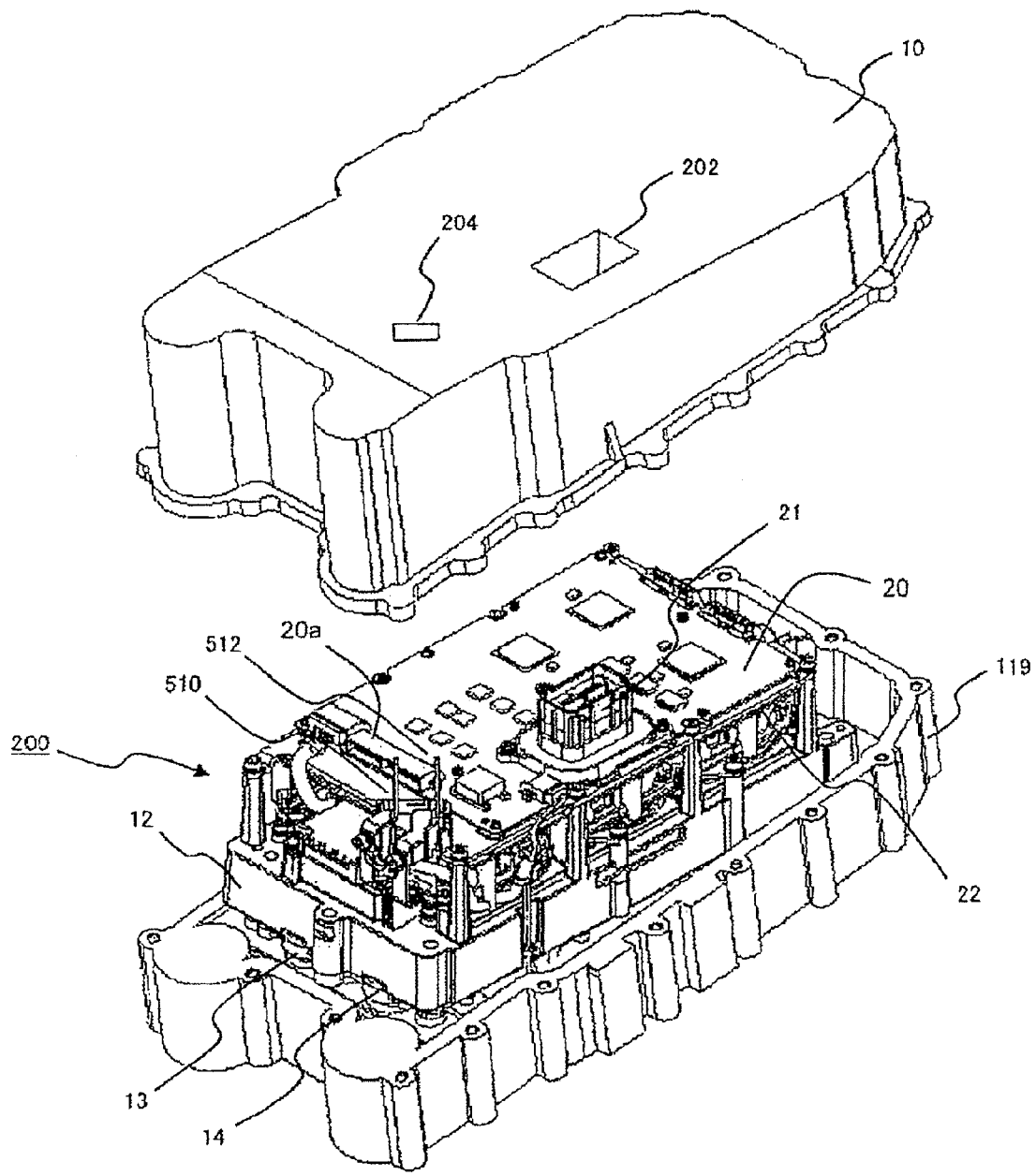
FIG. 3 is an exploded perspective view for describing an installation location of an electrical converter according to the present embodiment.

FIG. 3 is an exploded perspective view for describing an installation location of the electrical converter 200 according to the present embodiment.

The electrical converter 200 according to the present embodiment is fixed to an aluminum housing 119 for storing the transmission 118. Since the shapes of the bottom surface and the upper surface of the electrical converter 200 are substantially rectangular, the attachment to the vehicle is easy, and the production is facilitated. The cooling jacket 12 holds and cools a power module 300 and a capacitor module 500 described later by a cooling medium. The cooling jacket 12 is fixed to the housing 119, and an inlet piping 13 and an outlet piping 14 are formed on a surface facing the housing 119. The inlet piping 13 and the outlet piping 14 are connected to a piping formed on the housing 119, so that the cooling medium for cooling the transmission 118 flows into and out of the cooling jacket 12.

A case 10 covers the electrical converter 200 and is fixed to the housing 119. The bottom of the case 10 faces a control circuit board 20 provided with the control circuit 172. A first opening 202 and a second opening 204 connected to the outside from the bottom of the case 10 are formed on the bottom surface of the case 10. A connector 21 is connected to the control circuit board 20 and transmits various signals from the outside to the control circuit board 20. A battery negative electrode-side connection terminal section 510 and a battery positive electrode-side connection terminal section 512 are electrically connected to the battery 136 and the capacitor module 500.

The connector 21, the battery negative electrode-side connection terminal section 510, and the battery positive electrode-side connection terminal section 512 extend toward the bottom surface of the case 10. The connector 21 protrudes from the first opening 202, and the battery negative electrode-side connection terminal section 510 and the battery positive electrode-side connection terminal section 512 protrude from the second opening 204. Seal members (not shown) are disposed around the first opening 202 and the second opening 204 of the inner wall of the case 10.

Fitting surfaces of the terminals of the connector 21 and the like face various directions depending on the vehicle type. Particularly, when the connector 21 and the like are mounted on a small vehicle, it is preferable that the fitting surfaces face upward from the viewpoints of the restriction in the size of the engine room and the ease of assembly. Particularly, when the electrical converter 200 is disposed above the transmission 118 as in the present embodiment, the workability improves by causing the connector 21 and the like to protrude toward the opposite side of the arrangement side of the transmission 118. The connector 21 needs to be sealed from the outside atmosphere. The case 10 is assembled to the connector 21 from above, so that the seal member that comes in touch with the case 10 can press the connector 21 when the case 10 is assembled on the housing 119, and this improves airtightness.

Figure 4:
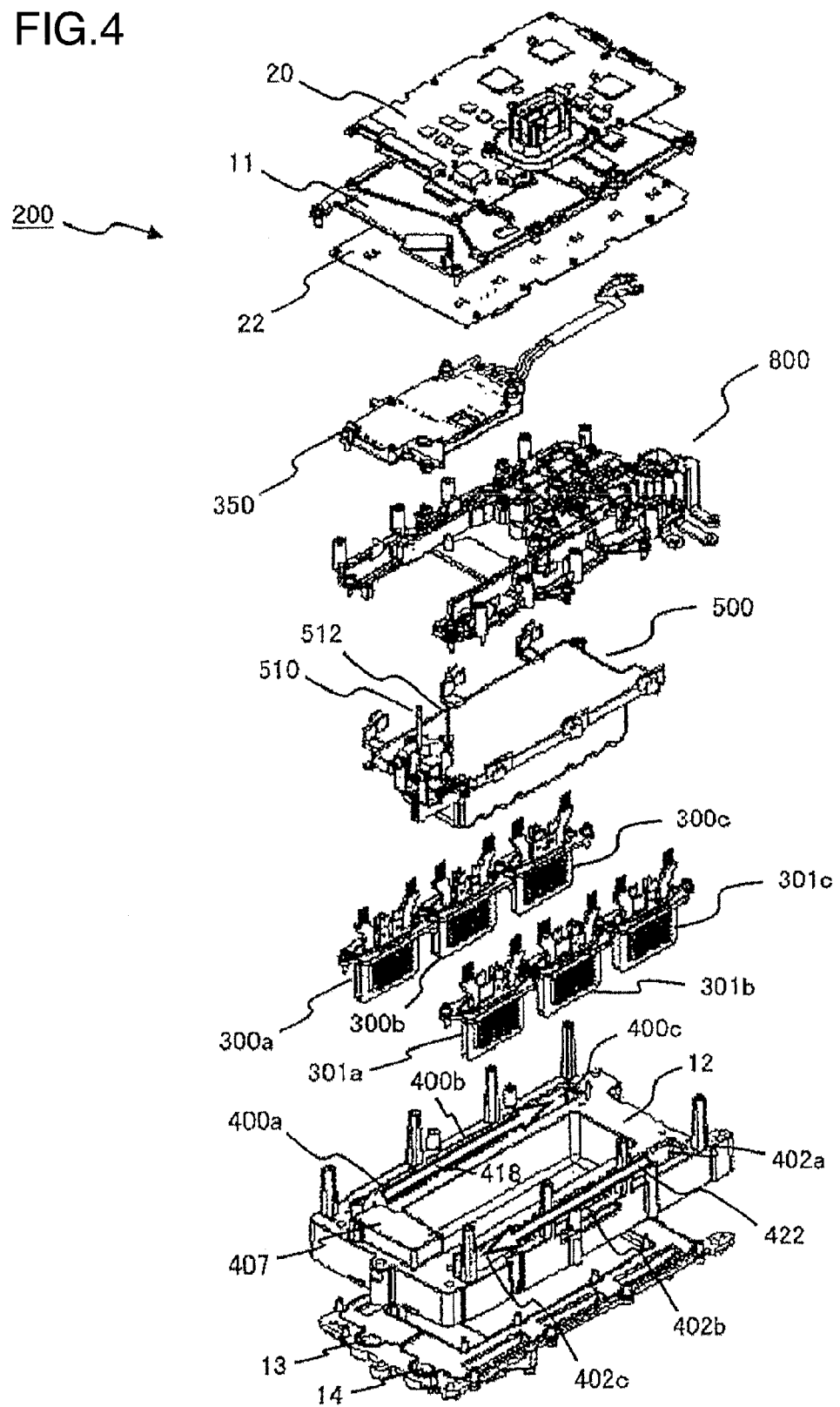
FIG. 4 is a perspective view exploding an overall configuration of the electrical converter into constituent elements according to the present embodiment.

FIG. 4 is a perspective view exploding an overall configuration of the electrical converter into constituent elements according to the present embodiment.

A channel 19 is disposed on the cooling jacket 12. On the upper surface of the channel 19, open sections 400a to 400c are formed along a flow direction 418 of a refrigerant, and open sections 402a to 402c are formed along a flow direction 422 of the refrigerant. Power modules 300a to 300c close the open sections 400a to 400c, and likewise, power modules 301a to 301c close the open sections 402a to 402c.

A storage space 405 for storing the capacitor module 500 is formed on the cooling jacket 12. The capacitor module 500 is stored in the storage space 405 and is cooled by the refrigerant flowing in the channel 19. The capacitor module 500 is placed between the channel 19 for forming the flow direction 418 of the refrigerant and the channel 19 for forming the flow direction 422 of the refrigerant, so that the capacitor module 500 can be efficiently cooled.

A protrusion 407 is formed on the cooling jacket 12, at a position facing the inlet piping 13 and the outlet piping 14. The protrusion 407 is integrally formed with the cooling jacket 12. An auxiliary machine power module 350 is fixed to the protrusion 407 and is cooled by the refrigerant flowing in the channel 19. A bus bar module 800 is disposed on a side of the auxiliary machine power module 350. The bus bar module 800 includes the alternating-current bus bar 186, the current sensor 180, and the like, and details will be described later.

In this way, the storage space 405 of the capacitor module 500 is arranged at the center section of the cooling jacket 12; the storage space 405 is arranged between the channels 19; the power modules 300a to 300c and the power modules 301a to 301c for driving vehicle are disposed on the channels 19; and the auxiliary machine power module 350 is disposed on the upper surface of the cooling jacket 12, so that the electrical converter can be efficiently cooled in a small space, and the overall electrical converter can be miniaturized. The main structure of the channel 19 of the cooling jacket 12 is made integrally with the cooling jacket 12 by aluminum casting, so that the channel 19 has a cooling effect as well as an effect of increasing the mechanical strength. Making by aluminum casting leads to an integral structure of the cooling jacket 12 and the channel 19, so that the heat conduction improves, and the cooling efficiency increases.

The power modules 300a to 300c and the power modules 301a to 301c are fixed to the channels 19 to complete the channels 19, and a leakage test of the water channel is conducted. When the leakage test is passed, works of attaching the capacitor module 500, the auxiliary machine power module 305, and the board can be performed. In this way, the cooling jacket 12 is disposed at the bottom section of the electrical converter 200, and then the work of fixing necessary parts, such as the capacitor module 500, the auxiliary machine power module 350, the bus bar module 800, and the board, can be sequentially conducted from above. This improves the productivity and the reliability.

A driver circuit board 22 is disposed above the auxiliary machine power module 350 and the bus bar module 800. A metal base plate 11 is disposed between the driver circuit board 22 and the control circuit board 20. The metal base plate 11 has a function of an electromagnetic shield of the circuit group mounted on the driver circuit board 22 and the control circuit board 20 and has an effect of cooling the driver circuit board 22 and the control circuit board 20 by releasing the generated heat.

Figure 5:
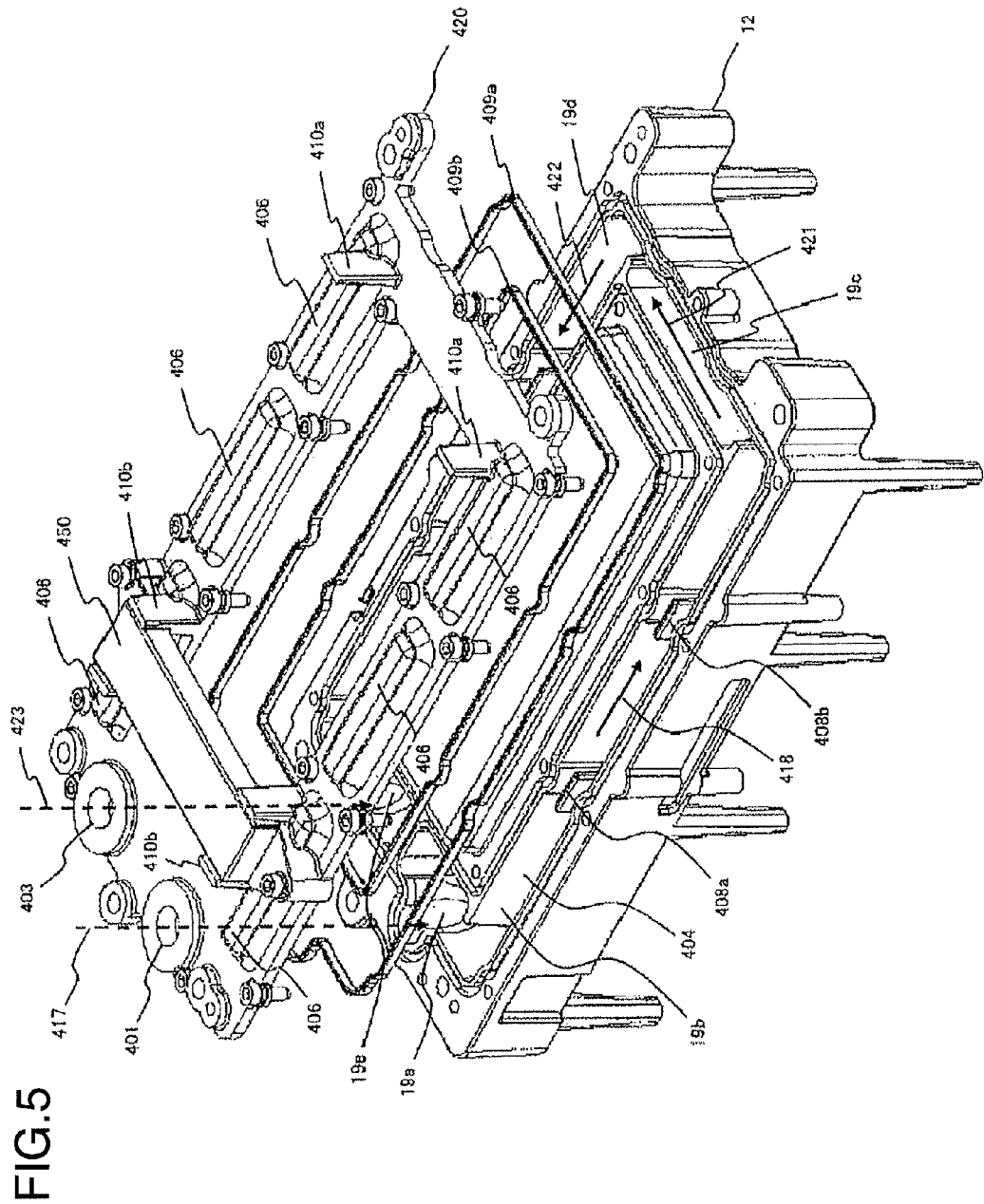
FIG. 5 is a bottom view of a cooling jacket including a channel.

FIG. 5 is a bottom view of the cooling jacket 12 including the channels 19.

The cooling jacket 12 and the channels 19 disposed inside of the cooling jacket 12 are integrally casted. An integrated open section 404 is formed on the lower surface of the cooling jacket 12. A lower cover 420 including an opening at the center section closes the open section 404. A seal member 409a and a seal member 409b are disposed between the lower cover 420 and the cooling jacket 12 to maintain the airtightness.

An inlet hole 401 for inserting the inlet piping 13 and an outlet hole 403 for inserting the outlet piping 14 are formed on the lower cover 420, near one edge and along the edge. Convex sections 406 protruding in the arrangement direction of the transmission 118 are formed on the lower cover 420. The convex section 406 is provided for each of the power modules 300a to 300c and the power modules 301a to 301c.

As shown by a flow direction 417, the refrigerant passes through the inlet hole 401 and flows toward a first channel section 19a formed along a side of the cooling jacket 12 in the transverse direction. As shown by a flow direction 418, the refrigerant flows through a second channel section 19b formed along a side of the cooling jacket 12 in the longitudinal direction. As shown by a flow direction 421, the refrigerant flows through a third channel section 19c formed along a side of the cooling jacket 12 in the transverse direction. The third channel section 19c forms a folded channel. As shown by a flow direction 422, the refrigerant flows through a fourth channel section 19d formed along a side of the cooling jacket 12 in the longitudinal direction. The fourth channel section 19d is arranged at a position facing the second channel section 19b across the capacitor module 500. As shown by a flow direction 423, the refrigerant passes through a fifth channel section 19e which is formed along a side of the cooling jacket 12 in the transverse direction and the outlet hole 403, and flows out to the outlet piping 14.

The first channel section 19a, the second channel section 19b, the third channel section 19c, the fourth channel section 19d, and the fifth channel section 19e are formed greater in the depth direction than in the width direction. The power modules 300a to 300c are inserted from the open sections 400a to 400c formed on the upper surface of the cooling jacket 12 (see FIG. 4) and are stored in storage spaces in the second channel section 19b. An intermediate member 408a for preventing stagnation of the flow of the refrigerant is formed between the storage space of the power module 300a and the storage space of the power module 300b. Similarly, an intermediate member 408b for preventing stagnation of the flow of the refrigerant is formed between the storage space of the power module 300b and the storage space of the power module 300c. Main surfaces of the intermediate member 408a and the intermediate member 408b are formed along the flow direction of the refrigerant. Like the second channel section 19b, the fourth channel section 19d also forms storage spaces of the power modules 301a to 301c and intermediate members. Since the open section 404 and the open sections 400a to 400c as well as 402a to 402c are formed to face each other, the cooling jacket 12 can be easily manufactured by aluminum casting.

The lower cover 420 is provided with support sections 410a and support sections 410b that are abutted to the housing 119 and that support the electrical converter 200. The support sections 410a are arranged close to one of the edges of the lower cover 420, and the support sections 410b are arranged close to the other edge of the lower cover 420. As a result, the electrical converter 200 can be strongly fixed to the sidewalls of the housing 119 formed according to the cylindrical shapes of the transmission 118 and the motor generator 192.

The support sections 410b are configured to support a resistor 450. The resistor 450 is for discharging the electric charge accumulated on capacitor cells in order to protect passengers or to provide safety during maintenance. Although the resistor 450 is configured to continuously discharge high-voltage electricity, the resistor 450 needs to be capable of minimizing damage to the vehicle even if there is an abnormality in the resistor or discharge mechanism. More specifically, when the resistor 450 is arranged around the power modules, the capacitor module, the driver circuit board, or the like, fire may possibly spread near the main parts if there is a trouble such as heat generation and ignition in the resistor 450.

In the present embodiment, the power modules 300a to 300c, the power modules 301a to 301c, and the capacitor module 500 are arranged on the opposite side of the housing 119 storing the transmission 118, across the cooling jacket 12, and the resistor 450 is arranged in the space between the cooling jacket 12 and the housing 119, so that the resistor 450 comes to be arranged in a closed space surrounded by the cooling jacket 12 and the housing 119 formed by metal. Switching operation of the switching means mounted on the driver circuit board 22 shown in FIG. 4 controls and discharges the electric charge accumulated on the capacitor cells in the capacitor module 500 to the resistor 450 through wiring on a side of the cooling jacket 12. In the present embodiment, the switching means controls to attain fast discharge. The cooling jacket 12 is disposed between the driver circuit board 22 that controls the discharge and the resistor 450, so that the driver circuit board 22 can be protected from the resistor 450. The resistor 450 is fixed to the lower cover 420 and is disposed at a position thermally very close to the channel 19, so that abnormal heat generation of the resistor 450 can be prevented.

Figure 6:
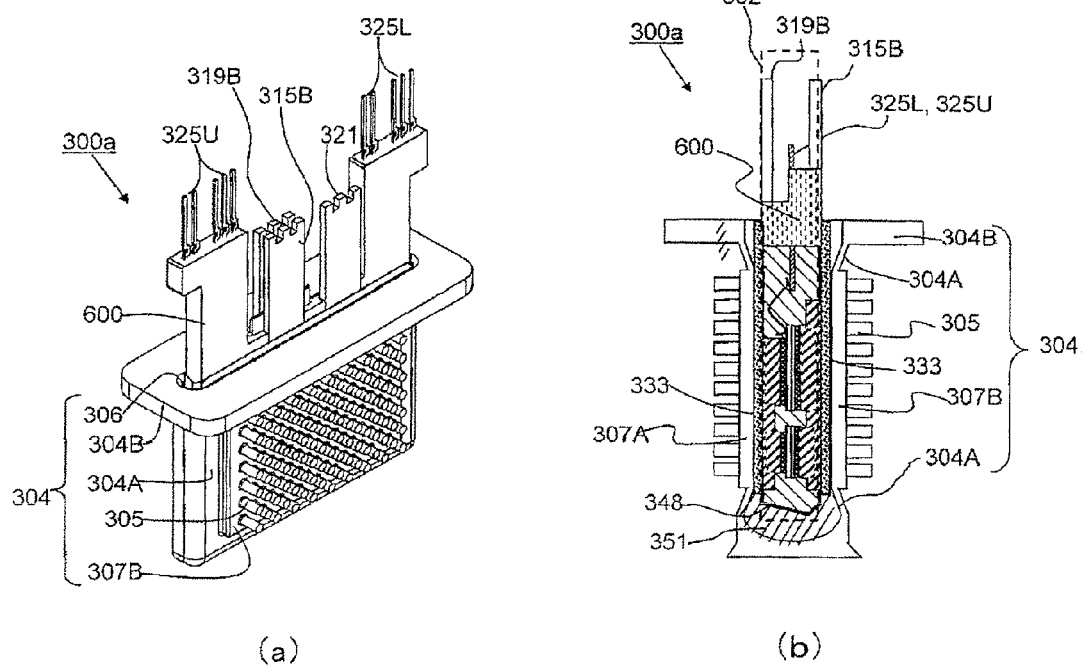
[FIG. 6](a) is a perspective view of a power module of the present embodiment, and (b) is a cross-sectional view of the power module of the present embodiment.

A detailed configuration of the power module 300a used in the inverter unit 140 and the inverter unit 142 will be described with reference to FIGS. 6 to 10. FIG. 6(a) is a perspective view of the power module 300a of the present embodiment. FIG. 6(b) is a cross-sectional view of the power module 300a of the present embodiment.

Figure 7:
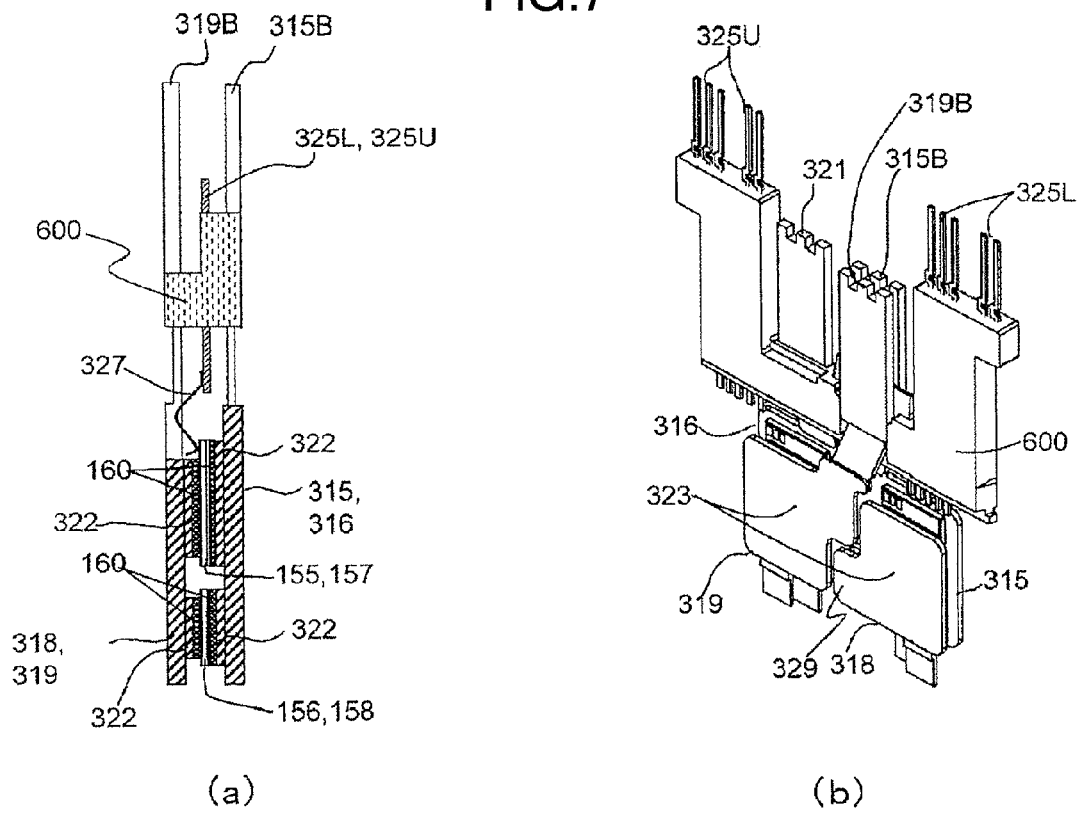
[FIG. 7](a) is an internal cross-sectional view excluding a module case, an insulating sheet, a first sealing resin, and a second sealing resin, and (b) is an internal perspective view.
Figure 8:
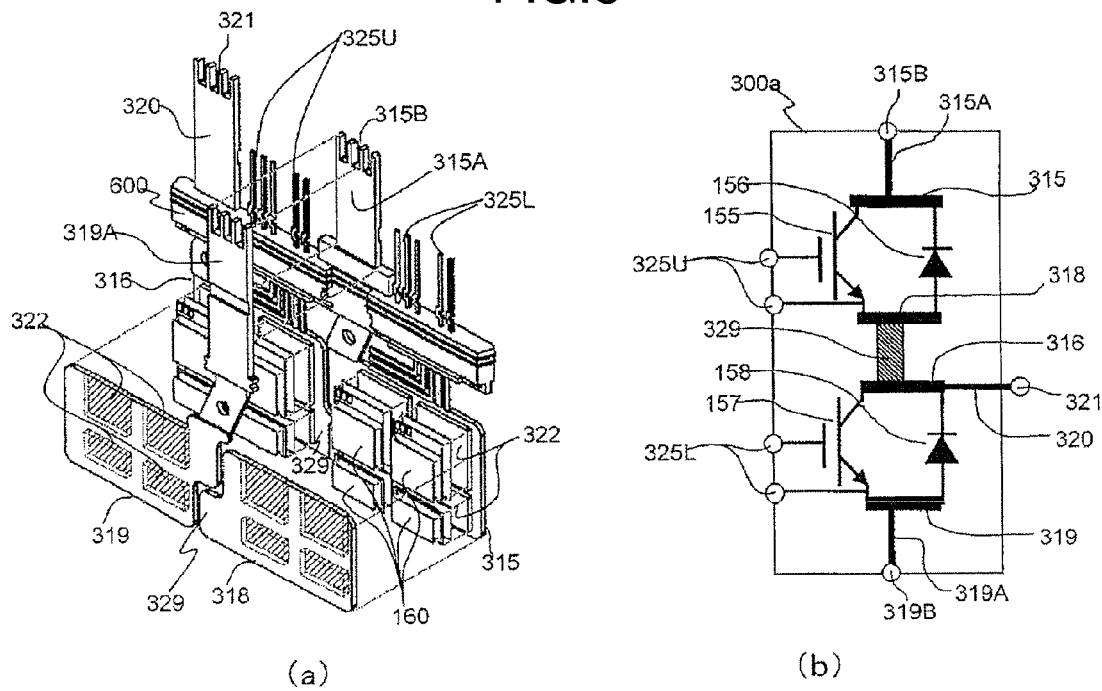
[FIG. 8](a) is an exploded view of a structure of FIG. 7(b), and (b) is a circuit diagram of a power semiconductor module.
Figure 9:
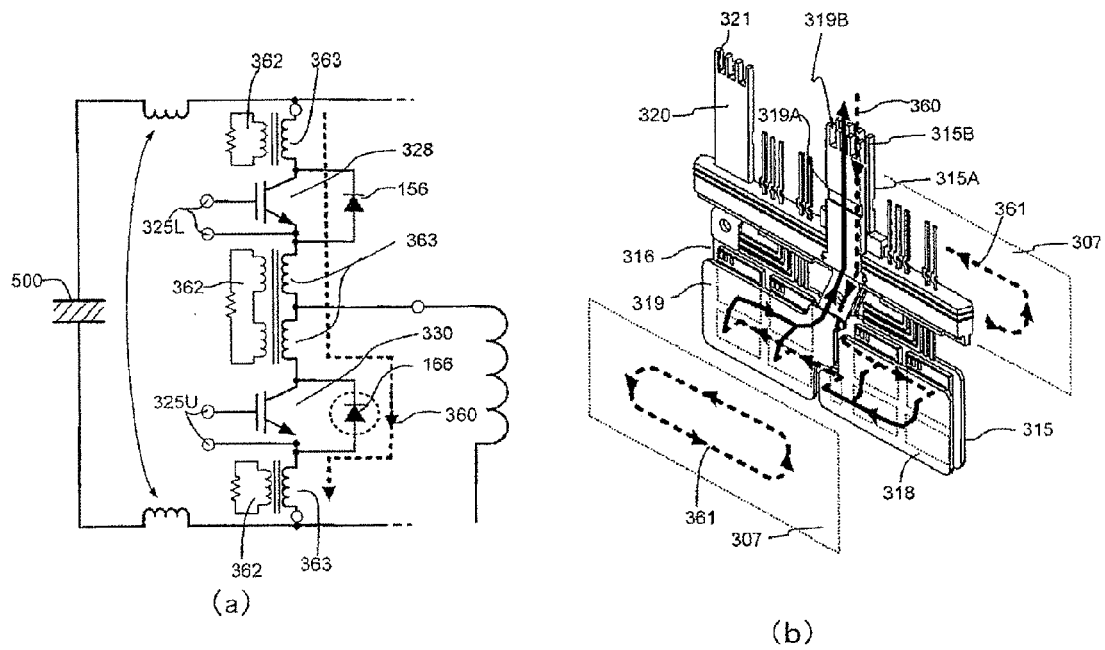
[FIG. 9](a) is a circuit diagram describing a reduction effect of inductance, and (b) is a perspective view showing a flow of current for describing the reduction function of inductance.
Figure 10:
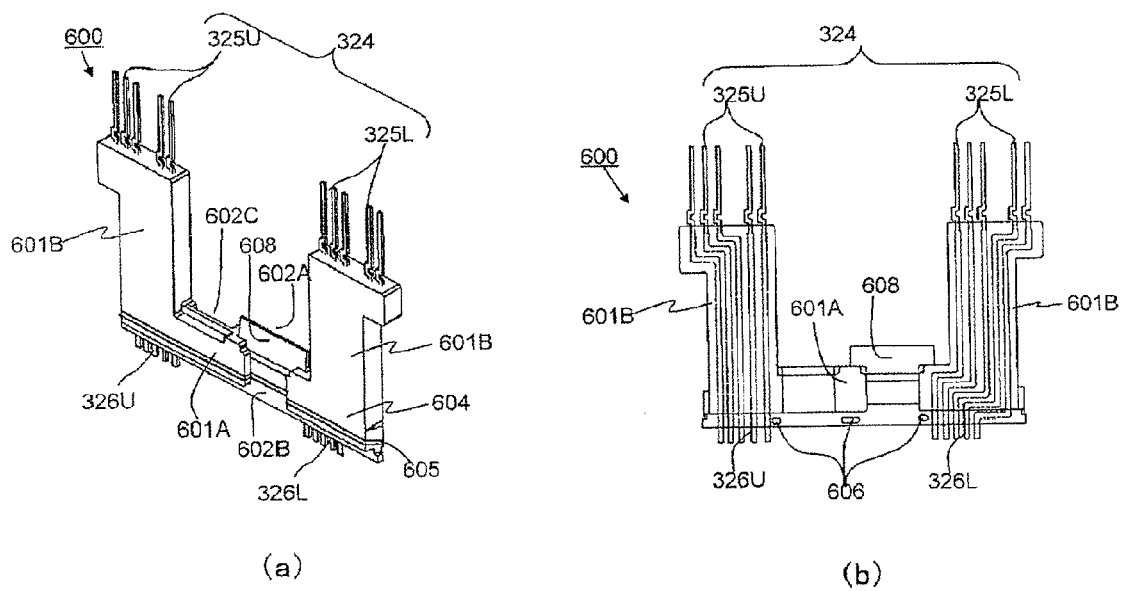
[FIG. 10](a) is a perspective view of an auxiliary mold body, and (b) is a transparent view of the auxiliary mold body.

The power semiconductor elements (IGBT 328, IGBT 330, diode 156, and diode 166) that constitute the upper and lower arms series circuit are sandwiched and fixed by conductor plates 315 and conductor plates 318 or by conductor plates 316 and conductor plates 319 as shown in FIGS. 7 to 9. Auxiliary mold bodies 600 with integrally molded signal wiring, which includes signal terminals 325U and signal terminals 325L, are assembled to the conductor plates. The conductor plates 315 and the like are sealed by a first sealing resin 348 while the heat dissipating surfaces are exposed, and insulating sheets 333 are thermally bonded to the heat dissipating surfaces. A module primary sealing body 302 sealed by the first sealing resin 348 is inserted to the module case 304 and thermally bonded to the inner surface of a module case 304 that is a CAN cooler, across the insulating sheet 333. The CAN cooler is a cooler in a cylindrical shape including an insertion opening 306 on one surface and including a bottom on the other surface.

The module case 304 is made of an aluminum alloy material, such as Al, AlSi, AlSiC, and Al—C, and is integrally molded without joints. The module case 304 does not include an opening other than the insertion opening 306, and the outer periphery of the insertion opening 306 is surrounded by a flange 304B. As shown in FIG. 6(a), a first heat dissipating surface 307A and a second heat dissipating surface 307B with greater surfaces than the other surfaces are arranged to face each other. Three surfaces connecting the opposing first heat dissipating surface 307A and second heat dissipating surface 307B form airtight surfaces at a width narrower than the first heat dissipating surface 307A and the second heat dissipating surface 307B. The insertion opening 306 is formed on the surface of the remaining one side. The shape of the module case 304 does not have to be an accurate rectangular parallelepiped, but angles may have curved surfaces as shown in FIG. 6(a).

By using the metal case in such a shape, sealing from a refrigerant such as water and oil can be ensured by the flange 304B, even if the module case 304 is inserted to the channel 19 through which the refrigerant flows. Therefore, entering of the cooling medium inside of the module case 304 can be prevented by a simple configuration. Fins 305 are uniformly formed on the opposing first heat dissipating surface 307A and second heat dissipating surface 307B. Extremely thin bent sections 304A are formed on the outer peripheries of the first heat dissipating surface 307A and the second heat dissipating surface 307B. Since the bent sections 304A are extremely thin so that the bent sections 304A can be easily deformed by pressurizing the fins 305, the productivity after the insertion of the module primary sealing body 302 is improved.

A second sealing resin 351 fills the gap remained inside of the module case 304. As shown in FIGS. 8 and 9, a direct-current positive electrode wiring 315A and a direct-current negative electrode wiring 319A for electrical connection with the capacitor module 500 are arranged, and a direct-current positive electrode terminal 315B and a direct-current negative electrode terminal 319B are formed at tip sections of the wiring. An alternating-current wiring 320 for supplying alternating-current power to the motor generator 192 or 194 is arranged, and an alternating-current terminal 321 is formed at a tip of the wiring. In the present embodiment, the direct-current positive electrode wiring 315A is integrally molded with the conductor plate 315, the direct-current negative electrode wiring 319A is integrally molded with the conductor plate 319, and the alternating-current wiring 320 is integrally molded with the conductor plate 316.

The thermal bonding of the conductor plates 315 and the like to the inner wall of the module case 304 through the insulating sheets 333 as described above can reduce the gap between the conductor plates and the inner walls of the module case 304 and can efficiently transmit the generated heat of the power semiconductor elements to the fins 305. The insulating sheet 333 has some thickness and flexibility, so that the insulating sheet 333 can absorb thermal stress, and the insulating sheet 333 is suitable for use in the electrical converter for the vehicle with rapid temperature change.

FIG. 7(a) is an internal cross-sectional view excluding the module case 304, the insulating sheet 333, the first sealing resin 348, and the second sealing resin 351 to assist understanding. FIG. 7(b) is an internal perspective view.

FIG. 8(a) is an exploded view for assisting in understand a structure of FIG. 7(b). FIG. 8(b) is a circuit diagram of the power semiconductor module 300.

FIG. 9(a) is a circuit diagram describing a reduction effect of inductance. FIG. 9(b) is a perspective view showing a flow of current for describing the reduction function of inductance.

The arrangement of the power semiconductor elements (IGBT 328, IGBT 330, diode 156, and diode 166) and the conductor plates will be described in association with the electric circuit shown in FIG. 8(b). As shown in FIG. 7(b), the conductor plate 315 on the direct-current positive electrode side and the conductor plate 316 on the alternating-current output side are disposed on substantially the same plane. The collector electrode of the IGBT 328 of the upper arm and the cathode electrode of the diode 156 of the upper arm are fixed to the conductor plate 315. The collector electrode of the IGBT 330 of the lower arm and the cathode electrode of the diode 166 of the lower arm are fixed to the conductor plate 316. Similarly, the alternating-current conductor plate 318 and the conductor plate 319 are disposed on substantially the same plane. The emitter electrode of the IGBT 328 of the upper arm and the anode electrode of the diode 156 of the upper arm are fixed to the alternating-current conductor plate 318. The emitter electrode of the IGBT 330 of the lower arm and the anode electrode of the diode 166 of the lower arm are fixed to the conductor plate 319. Each power semiconductor element is fixed to an element fixation section 322 disposed on each conductor plate, through a metal bonding material 160. Examples of the metal bonding material 160 include a soldering material, a silver sheet, and a low-temperature sintering bonding material including microscopic metallic particles.

The power semiconductor elements have plate-like flat structures, and the electrodes of the power semiconductor elements are formed on front and back surfaces. As shown in FIG. 7(a), the electrodes of the power semiconductor elements are placed between the conductor plate 315 and the conductor plate 318 or between the conductor plate 316 and the conductor plate 319. Accordingly, the conductor plate 315 and the conductor plate 318 are arranged in stack, facing each other substantially in parallel through the IGBT 328 and the diode 156. Similarly, the conductor plate 316 and the conductor plate 319 are arranged in stack, facing each other substantially in parallel through the IGBT 330 and the diode 166. The conductor plate 316 and the conductor plate 318 are connected through an intermediate electrode 329. By this connection, the upper arm circuit and the lower arm circuit are electrically connected, and the upper and lower arms series circuit is formed.

The direct-current positive electrode wiring 315A and the direct-current negative electrode wiring 319A have shapes extending substantially in parallel, while facing each other through the auxiliary mold body 600 molded by a resin material. The signal terminal 325U and the signal terminal 325L are integrally molded with the auxiliary mold body 600, extending in directions similar to the direct-current positive electrode wiring 315A and the direct-current negative electrode wiring 319A. A thermosetting resin or a thermoplastic resin with insulation is suitable for the resin material used in the auxiliary mold body 600. This can ensure the insulation among the direct-current positive electrode wiring 315A, the direct-current negative electrode wiring 319A, the signal terminal 325U, and the signal terminal 325L, and highly dense wiring is possible. Further, the direct-current positive electrode wiring 315A and the direct-current negative electrode wiring 319A are disposed to face each other substantially in parallel, so that currents that instantaneously flow during the switching operation of the power semiconductor elements oppose each other and flow in opposite directions. As a result, magnetic fields created by the currents cancel each other, and this function can reduce the inductance.

The function of the reduction in the inductance will be described with reference to FIG. 9(a).

In FIG. 9(a), it is assumed that the diode 166 of the lower arm is conducted in a forward bias state. When the IGBT 328 of the upper arm is turned on in this state, the diode 166 of the lower arm enters a backward bias state, and a recovery current caused by carrier transfer penetrates through the upper and lower arms. In this case, a recovery current 360 shown in FIG. 9(b) flows through the conductor plates 315, 316, 318, and 319. As shown by a dotted line, the recovery current 360 passes through the direct-current positive electrode terminal 315B facing the direct-current negative electrode terminal 319B, then flows in a loop-shape path formed by the conductor plates 315, 316, 318, and 319, and again flows as shown by a solid line through the direct-current negative electrode terminal 319B facing the direct-current positive electrode terminal 315B. As a result of the flow of the current in the loop-shape path, an eddy current 361 flows through the first heat dissipating surface 307A and the second heat dissipating surface 307B of the module case 304. This magnetic field canceling effect generated by an equivalent circuit 362 in the current path of the eddy current 361 reduces wiring inductance 363 in the loop-shape path.

The inductance reduction function increases as the current path of the recovery current 360 becomes closer to the loop shape. In the present embodiment, as shown by a dotted line, the current path of the loop shape flows through a path closer to the direct-current positive electrode terminal 315B of the conductor plate 315 and passes through the IGBT 328 and the diode 156. Then, as shown by a solid line, the current path of the loop shape flows through a path far from the direct-current positive electrode terminal 315B of the conductor plate 318, then passes through a path far from the direct-current positive electrode terminal 315B of the conductor plate 316 as shown by a dotted line, and passes through the IGBT 330 and the diode 166. As shown by a solid line, the current path of the loop shape further flows through a path close to the direct-current negative electrode wiring 319A of the conductor plate 319. In this way, the current path of the loop shape passes through the close and far paths relative to the direct-current positive electrode terminal 315B and the direct-current negative electrode terminal 319B, so that a current path closer to the loop shape is formed.

FIG. 10(a) is a perspective view of the auxiliary mold body 600. FIG. 10(b) is a transparent view of the auxiliary mold body 600.

The auxiliary mold body 600 integrates a signal conductor 324 by insertion molding. The signal conductor 324 includes the gate electrode terminal 154 and the emitter electrode terminal 155 of the upper arm, the gate electrode terminal 164 and the emitter electrode terminal 165 of the upper arm (see FIG. 2), and a terminal for transmitting temperature information of the power semiconductor elements. In the description of the present embodiment, the terminals will be collectively expressed as signal terminals 325U and 325L.

The signal conductor 324 forms the signal terminals 325U and 325L on one end and forms element-side signal terminals 326U and 326L on the other end. The element-side signal terminals 326U and 326L are connected to signal pads disposed on surface electrodes of the power semiconductor elements, by wires for example. A first sealing section 601A has a shape extending in a direction crossing the major axis of the shape of the direct-current positive electrode wiring 315A, the direct-current negative electrode wiring 319A, or the alternating-current wiring 320 shown in FIG. 8(a). Meanwhile, a second sealing section 601B has a shape extending in a direction substantially parallel to the major axis of the shape of the direct-current positive electrode wiring 315A, the direct-current negative electrode wiring 319A, or the alternating-current wiring 320. The second sealing section 601B includes a sealing section for sealing the signal terminals 325U of the upper arm and a sealing section for sealing the signal terminals 325L of the lower arm.

The length of the auxiliary mold body 600 is longer than the total length of the conductor plates 315 and 316 aligned side by side or longer than the total length of the conductor plates 319 and 320 aligned side by side. Therefore, the length of the conductor plates 315 and 316 aligned side by side or the length of the conductor plates 319 and 320 aligned side by side is within the length of the auxiliary mold body 600 in the horizontal direction.

The first sealing section 601A forms a wiring fitting section 602B that has a depressed shape and that is for fitting the direct-current negative electrode wiring 319A in the depression. The first sealing section 601A forms a wiring fitting section 602A that has a depressed shape and that is for fitting the direct-current positive electrode wiring 315A in the depression. The first sealing section 601A further forms a wiring fitting section 602C in a depressed shape that is disposed on a side of the wiring fitting section 602A and that is for fitting the alternating-current wiring 320 in the depression. Wires are fitted to the wiring fitting sections 602A to 602C to position the wires. As a result, filling work of a resin sealing material can be performed after strongly fixing the wires, and the mass productivity improves.

A wiring insulating section 608 protrudes in a direction away from the first sealing section 601A, from between the wiring fitting section 602A and the wiring fitting section 602B. The wiring insulating section 608 in a plate shape is placed between the direct-current positive electrode wiring 315A and the direct-current negative electrode wiring 319A, and this enables an opposing arrangement for reducing the inductance, while ensuring the insulation.

A die pressing surface 604 that comes into contact with a die used for resin sealing is formed on the first sealing section 601A, and a protrusion 605 for preventing leakage of the resin in the resin sealing is formed on the die pressing surface 604, around the entire outer periphery of the first sealing section 601 in the longitudinal direction. A plurality of protrusions 605 are arranged to increase the effect of preventing the resin leakage. The protrusions 605 are also arranged on the wiring fitting section 602A and the wiring fitting section 602B. This can prevent the resin sealing material from leaking from around the direct-current positive electrode wiring 315A and the direct-current negative electrode wiring 319A. Considering the placement on a die at about 150 to 180° C., desirable materials of the first sealing section 601A, the second sealing section 601B, and the protrusions 605 include a thermoplastic liquid crystal polymer or polybutylene terephthalate (PBT) and polyphenylene sulfide resins (PPS) with potentially high thermal resistance.

On the power semiconductor element side of the first sealing section 601A in the transverse direction, a plurality of penetration holes 606 shown in FIG. 10(b) are arranged in the longitudinal direction. As a result, the first sealing resin 348 flows in the penetration holes 606 and cured, and an anchor effect is generated, so that the first sealing resin 348 strongly holds the auxiliary mold body 600, and they are not peeled off under stress by temperature change or mechanical vibration. In place of the penetration holes, irregular shapes can also prevent them from being easily peeled off. This effect can also be attained to some extent by applying a polyimide coating agent to the first sealing section 601A or by roughening the surface.

In a sealing step of the first sealing resin 348 in the module primary sealing body 302, the auxiliary mold body 600 supporting the wires is inserted to a die with remaining heat of about 150 to 180° C. In the present embodiment, the auxiliary mold body 600, the direct-current positive electrode wiring 315A, the direct-current negative electrode wiring 319A, the alternating-current wiring 320, the conductor plate 315, the conductor plate 316, the conductor plate 318, and the conductor plate 319 are strongly connected, so that the main circuits and the power semiconductor elements are installed at predetermined positions by installing the auxiliary mold body 600 at a predetermined position. Accordingly, the productivity improves, and the reliability improves.

The second sealing section 601B is formed to extend from near the module case 304 to near the driver circuit board 22. As a result, a switching control signal can be normally transmitted even under high voltage, in the wiring with the driver circuit board 22 through high-current wires. Further, even if the direct-current positive electrode wiring 315A, the direct-current negative electrode wiring 319A, the alternating-current wiring 320, the signal terminal 325U, and the signal terminal 325L protrude in the same direction from the module case 304, the electrical insulation can be ensured, and the reliability can be ensured.

Figure 11:
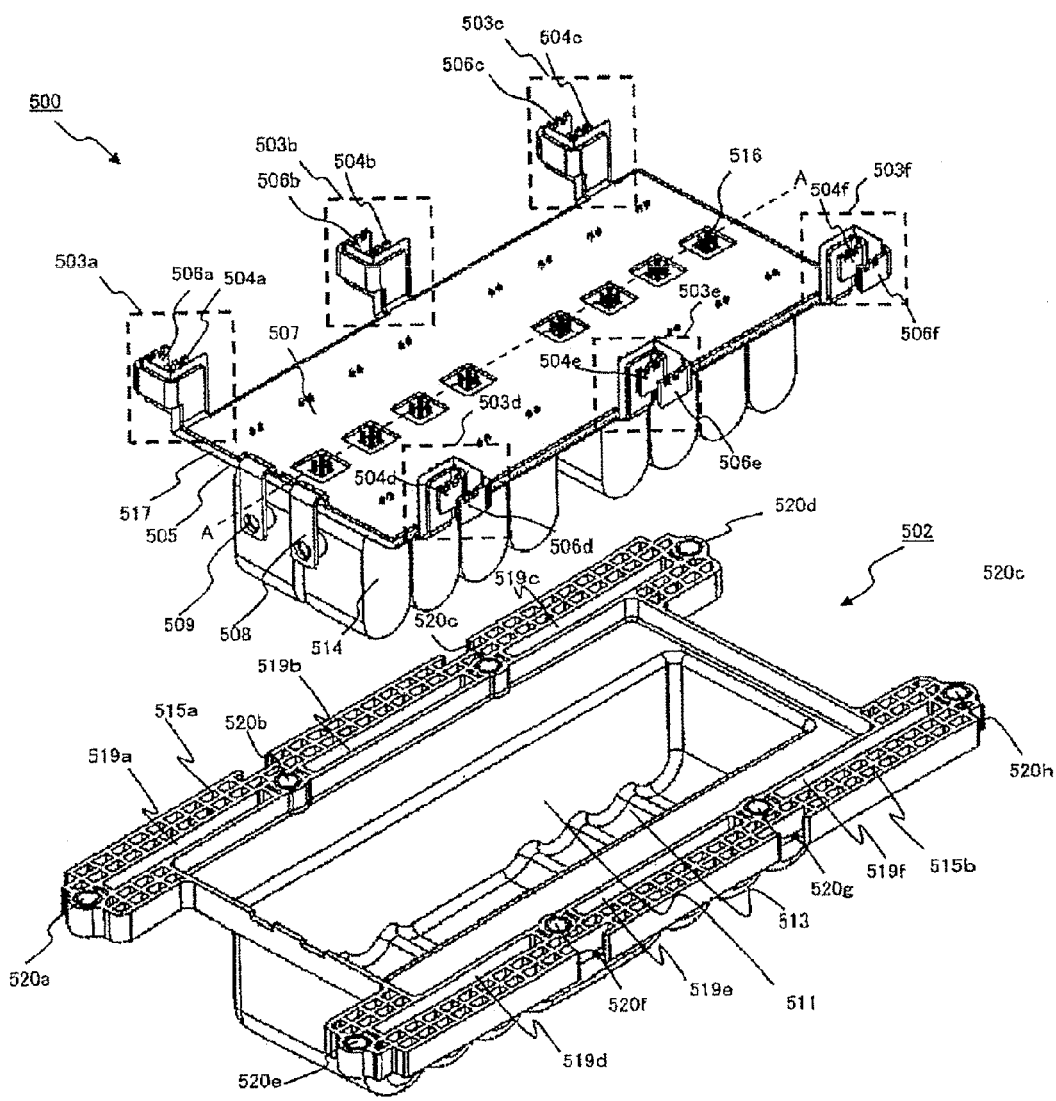
FIG. 11 is an exploded perspective view of a capacitor module of the present embodiment.

FIG. 11 is an exploded perspective view of the capacitor module 500 of the present embodiment.

A laminated conductor plate 501 includes a negative electrode conductor plate 505 and a positive electrode conductor plate 507 formed by plate-like wide conductors and includes an insulating sheet 517 placed between the negative electrode conductor plate 505 and the positive electrode conductor plate 507, so that the inductance is reduced. The laminated conductor plate 501 has a substantially rectangular shape. A battery negative electrode-side terminal 508 and a battery negative electrode-side terminal 509 are formed to rise from one of the sides of the laminated conductor plate 501 in the transverse direction.

Capacitor terminals 503a to 503c are formed to rise from one of the sides of the laminated conductor plate 501 in the longitudinal direction. Capacitor terminals 503d to 503f are formed to rise from the other side of the laminated conductor plate 501 in the longitudinal direction. The capacitor terminals 503a to 503f rise in a direction crossing the main surface of the laminated conductor plate 501. The capacitor terminals 503a to 503c are connected to the power modules 300a to 300c, respectively. The capacitor terminals 503d to 503f are connected to the power modules 301a to 301c, respectively. A portion of the insulating sheet 517 is disposed between a negative electrode-side capacitor terminal 504a and a positive electrode-side capacitor terminal 506a included in the capacitor terminal 503a, and insulation is secured. The same applies to the other capacitor terminals 503b to 503f. In the present embodiment, the negative electrode conductor plate 505, the positive electrode conductor plate 507, the battery negative electrode-side terminal 508, the battery negative electrode-side terminal 509, and the capacitor terminals 503a to 503f are formed by an integrally molded metal plate. This configuration reduces the inductance and improves the productivity.

A plurality of capacitor cells 514 are disposed below the laminated conductor plate 501. In the present embodiment, eight capacitor cells 514 are arranged in a line along one of the sides of the laminated conductor plate 501 in the longitudinal direction, and other eight capacitor cells 514 are arranged in a line along the other side of the laminated conductor plate 501 in the longitudinal direction. Sixteen capacitor cells are disposed in total. The capacitor cells 514 arranged along the sides of the laminated conductor plate 501 in the longitudinal direction are symmetrically arranged across a dotted line AA shown in FIG. 11. In this way, when direct current smoothed by the capacitor cells 514 are supplied to the power modules 300a to 300c and the power modules 301a to 301c, the current balance between the capacitor terminals 503a to 503c and the capacitor terminals 503d to 503f is leveled, and the inductance of the laminated conductor plate 501 can be reduced. Further, local flow of current in the laminated conductor plate 501 can be prevented, so that the thermal balance is leveled, and the thermal resistance can be also improved.

The battery negative electrode-side terminal 508 and the battery negative electrode-side terminal 509 are also symmetrically arranged across the dotted line AA shown in FIG. 11. Similarly, the current balance between the capacitor terminals 503a to 503c and the capacitor terminals 503d to 503f is leveled, and the inductance of the laminated conductor plate 501 can be reduced. Further, the thermal balance is also leveled, and the thermal resistance can be improved.

The capacitor cell 514 of the present embodiment is a unit structure of electricity storage of the capacitor module 500 and is a film capacitor formed by laminating and winding two films on which metal such as aluminum is deposited on one side, wherein the two metal films serve as a positive electrode and a negative electrode. The wound axial surfaces serve as the positive electrode and the negative electrode of the capacitor cell 514, and a conductor such as tin is sprayed to manufacture the capacitor cell 514. A cell terminal 516 and a cell terminal 518 are connected to the positive electrode and the negative electrode, and are extended to the opposite side of the arrangement of the capacitor cell 514 through the open section of the laminated conductor plate 501. The cell terminal 516 and the cell terminal 518 are connected to the positive electrode conductor plate 507 and the negative electrode conductor plate 505 by soldering or welding.

A capacitor case 502 includes a storage 511 for storing the capacitor cells 514, and an upper surface and a lower surface of the storage 511 have substantially rectangular shapes. A flange section 515a is disposed on one of the sides of the storage 511 in the longitudinal direction, and a flange section 515b is disposed on the other side. The flange section 515a is provided with penetration holes 519a to 519c through which the terminals extending from the insertion opening 306 of the module case 304 penetrate. Similarly, the flange section 515b is provided with penetration holes 519d to 519f. Further, holes 520a to 520h, through which a fixation means for fixing the capacitor module 500 to the cooling jacket 12 penetrates, are disposed on the sides of the penetration holes 519a to 519f. The airtightness between the power module and the channel 19 is improved by arranging the holes 520b, 520c, 520f, and 520g between the power module and the channel 19. The flange section 515a and the flange section 515b form a honeycomb structure to reduce the weight of the capacitor case 502 and to improve the strength of fixation to the cooling jacket 12.

A bottom surface section 513 of the storage 511 has a smooth irregular shape or a waveform shape according to the surface shape of the cylindrical capacitor cells 514. As a result, the module connected with the laminated conductor plate 501 and the capacitor cells 514 can be easily positioned on the capacitor case 502. After the laminated conductor plate 501 and the capacitor cells 514 are stored in the capacitor case 502, a filler (not shown) is supplied inside of the capacitor case 502 to cover the laminated conductor plate 501, except the capacitor terminals 503a to 503f, the battery negative electrode-side terminal 508, and the battery negative electrode-side terminal 509. The bottom surface section 513 has a waveform shape according to the shape of the capacitor cells 514. This can prevent the capacitor cells 514 from being displaced from predetermined positions when the filler is supplied inside of the capacitor case 502.

Due to a ripple current during switching, the capacitor cell 514 generates heat by the electric resistance of the metal thin film which is deposited on the inside film and of the internal conductor. Therefore, the capacitor cell 514 is molded by a filler to easily release the heat of the capacitor cell 514 to the capacitor case 502. Further, by using a resin filler the moisture resistance of the capacitor cell 514 can be also improved.

Since in the present embodiment, the sidewall of the capacitor module 500 forming the side of the storage 511 in the longitudinal direction is arranged between the channels 19, the capacitor module 500 can be efficiently cooled. The capacitor cell 514 is arranged so that one of the electrode surfaces of the capacitor cell 514 faces the inner wall forming the side of the storage 511 in the longitudinal direction. As a result, the heat is easily transmitted in the direction of the winding axis of the film, and the heat is easily released to the capacitor case 502 through the electrode surface of the capacitor cell 514.

Figure 12:
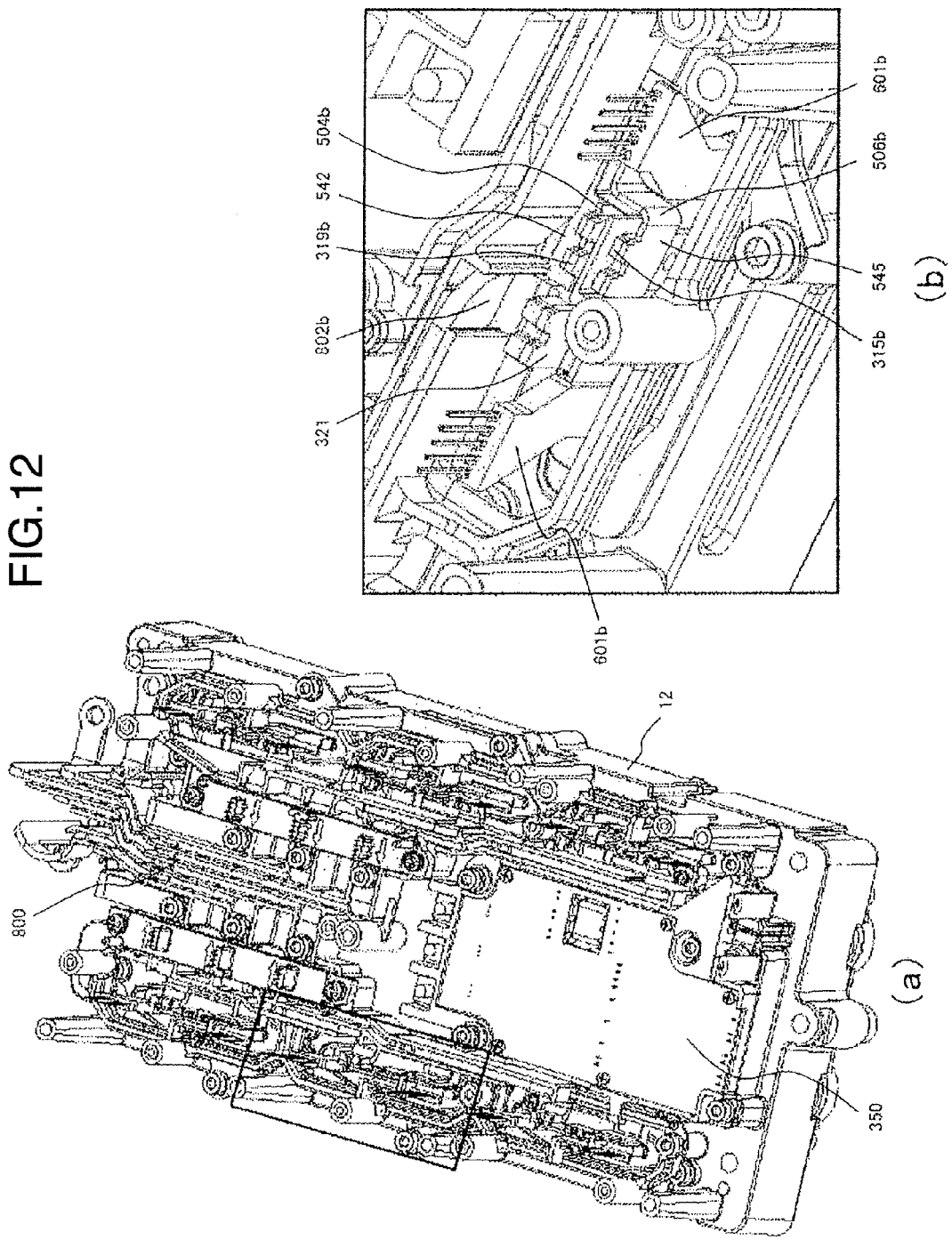
[FIG. 12](a) is an external perspective view in which the power module, the capacitor module, and a bus bar module are assembled on the cooling jacket, and (b) is an enlarged view of a section surrounded by dotted lines of (a).

FIG. 12(a) is an external perspective view in which the power module, the capacitor module, and the bus bar module are assembled on the cooling jacket 12. FIG. 12(b) is an enlarged view of a section surrounded by dotted lines of FIG. 12(a).

As shown in FIG. 12(b), the direct-current negative electrode terminal 315B, the direct-current positive electrode terminal 319B, the alternating-current terminal 321, and the second sealing section 601B extend above the flange section 515a through the penetration hole 519 of the capacitor case 502. The area of the current path of the direct-current negative electrode terminal 315B and the direct-current positive electrode terminal 319B is much smaller than the area of the current path of the laminated conductor plate 501. Accordingly, the area of the current path significantly changes when the current flows from the laminated conductor plate 501 to the direct-current negative electrode terminal 315B and the direct-current positive electrode terminal 319B. That is, the current is concentrated on the direct-current negative electrode terminal 315B and the direct-current positive electrode terminal 319B. When the direct-current negative electrode terminal 315B and the direct-current positive electrode terminal 319B protrude in a direction crossing the laminated conductor plate 501, in other words, when the direct-current negative electrode terminal 315B and the direct-current positive electrode terminal 319B are in a twisted relationship with the laminated conductor plate 501, a new connection conductor is necessary, which causes problems of reduced productivity and increased cost.

Therefore, in the present embodiment, the negative electrode-side capacitor terminal 504a includes: a rising section 540 rising from the laminated conductor plate 501; a folded section 541 connected to the rising section 540 and curved in a U shape; and a connection section 542 that is connected to the folded section 541 and in which the surface on the opposite side of the rising section 540 faces the main surface of the direct-current negative electrode terminal 319B. The positive electrode-side capacitor terminal 506a includes: a rising section 543 rising from the laminated conductor plate 501; a folded section 544; and a connection section 545 that is connected to the folded section 544 and in which the surface on the opposite side of the rising section 543 faces the main surface of the direct-current positive electrode terminal 315B. Particularly, the folded section 544 is connected to the rising section 543 at a substantially right angle and crosses the sides of the negative electrode-side capacitor terminal 504a, the direct-current negative electrode terminal 315B, and the direct-current positive electrode terminal 319B. The main surface of the rising section 540 and the main surface of the rising section 543 face each other through the insulating sheet 517. Similarly, the main surface of the folded section 541 and the main surface of the folded section 544 face each other through the insulating sheet 517.

As a result, the capacitor terminal 503a forms a laminate structure through the insulating sheet 517 up to just before the connection section 542, so that the wiring inductance of the capacitor terminal 503a with concentrated current can be reduced.

Further, it is constituted such that the folded section 544 crosses the sides of the negative electrode-side capacitor terminal 504a, the direct-current negative electrode terminal 315B, and the direct-current positive electrode terminal 319B. Further, the tip of the direct-current positive electrode terminal 319B and the side of the connection section 542 are connected by welding. Similarly, the tip of the direct-current negative electrode terminal 315B and the side of the connection section 545 are connected by welding.

As a result, the work direction for the welding connection of the direct-current positive electrode terminal 319B and the direct-current negative electrode terminal 315B does not interfere with the folded section 544, so that the productivity can be improved, while reducing the inductance.

The tip of the alternating-current terminal 321 and the tip of an alternating-current bus bar 802a are connected by welding. Production of a welding machine movable in a plurality of directions relative to the welding target in a production facility for welding complicates the production facility and is not preferable in terms of the productivity and cost. Therefore, in the present embodiment, the welding part of the alternating-current terminal 321 and the welding part of the direct-current positive electrode terminal 319B are arranged in a line along the side of the cooling jacket 12 in the longitudinal direction. As a result, welding can be performed a plurality of times while the welding machine moves in one direction, and the productivity improves.

As shown in FIGS. 4A and 12A, the plurality of power modules 300a to 300c are arranged in a line along the side of the cooling jacket 12 in the longitudinal direction. As a result, the productivity can be further improved in the welding of the plurality of the power modules 300a to 300c.

Figure 13:
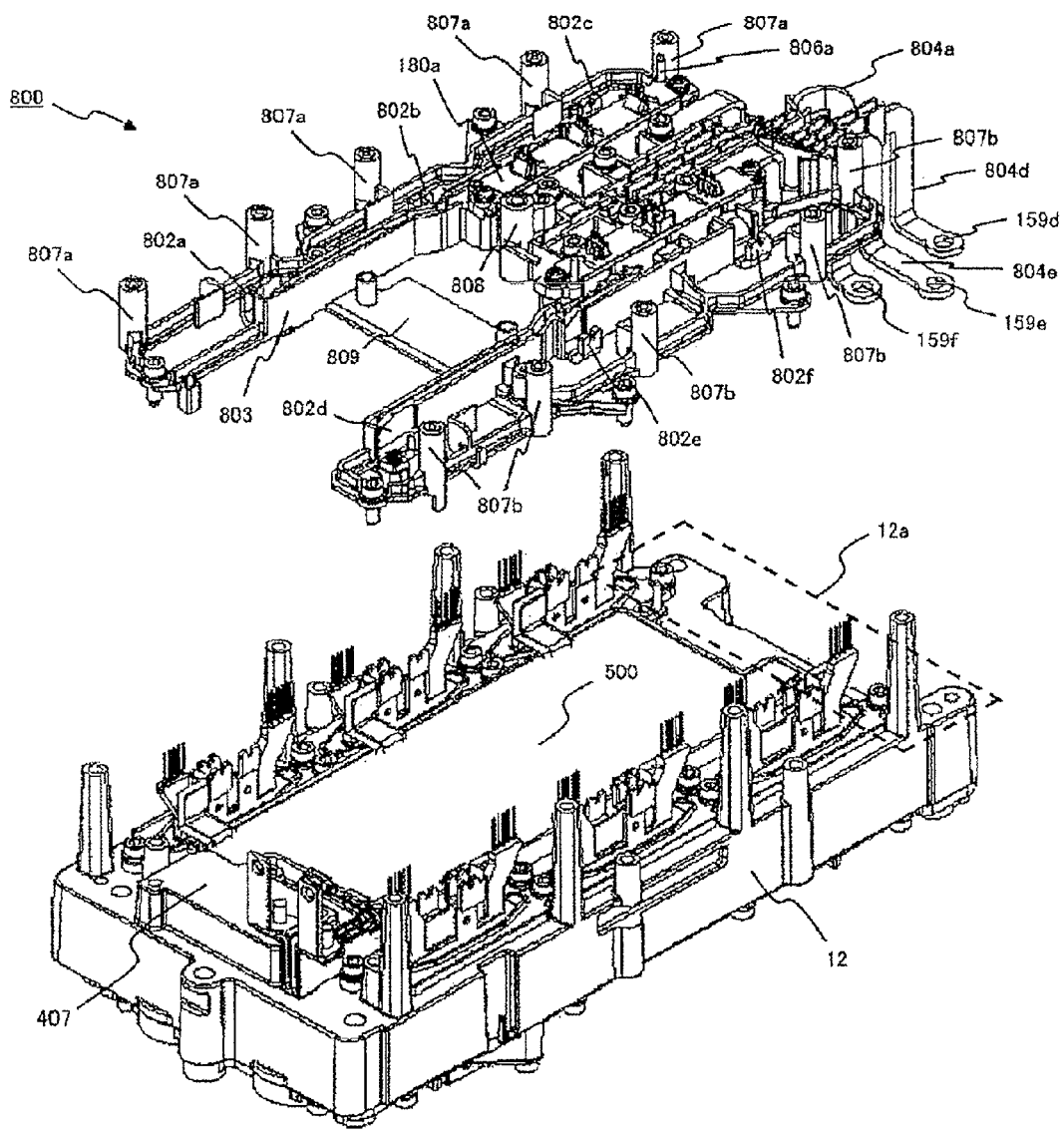
FIG. 13 is an exploded perspective view of the cooling jacket, on which the power module and the capacitor module are assembled, and the bus bar module.
Figure 14:
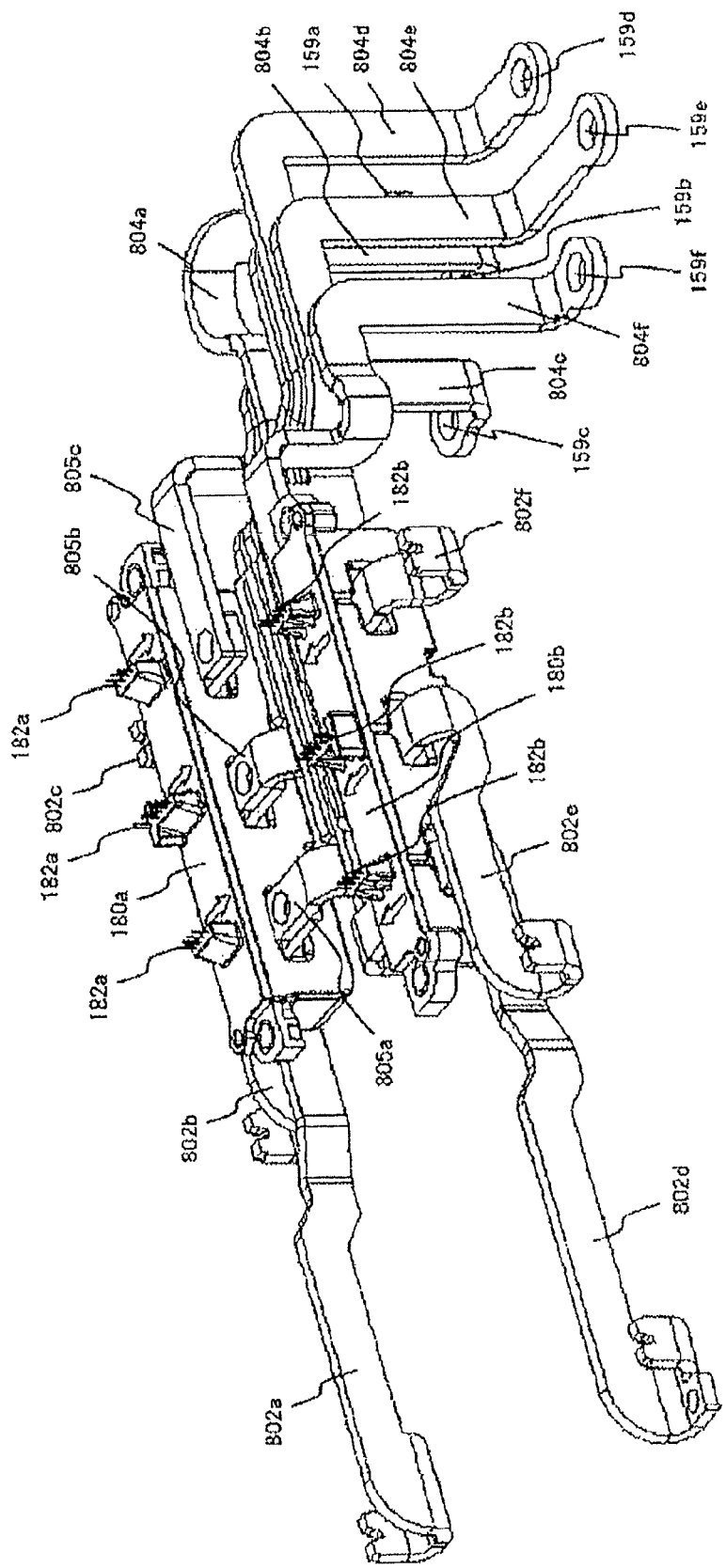
FIG. 14 is an external perspective view of the bus bar module excluding a holding member.

FIG. 13 is an exploded perspective view of the cooling jacket 12 on which the power module and the capacitor module are assembled, and the bus bar module 800. FIG. 14 is an external perspective view of the bus bar module 800 excluding a holding member 803.

As shown in FIGS. 13 and 14, first alternating-current bus bars 802a to 802f are formed so that the main surfaces of the first alternating-current bus bars 802a to 802f are substantially perpendicular to the main surface of the laminated conductor plate 501 of the capacitor module 500, up to the installation part of a current sensor 180a or a current sensor 180b. The first alternating-current bus bars 802a to 802f are bent at a right angle just before penetration holes of the current sensor 180a or penetration holes of the current sensor 180b. As a result, the main surfaces of the parts of the first alternating-current bus bars 802a to 802f penetrating through the current sensor 180a or the current sensor 180b are substantially parallel to the main surface of the laminated conductor plate 501. Further, connection sections 805a to 805f for connection with second alternating-current bus bars 804a to 804f are formed at the ends of the first alternating-current bus bars 802a to 802f (the connection sections 805d to 805f are not shown).

The second alternating-current bus bars 804a to 804f are bent at a substantially right angle toward the capacitor module 500, near the connection sections 805a to 805f. As a result, the main surfaces of the second alternating-current bus bars 804a to 804f are formed to be substantially perpendicular to the main surface of the laminated conductor plate 501 of the capacitor module 500. Further, the second alternating-current bus bars 804a to 804f are formed to extend from near the current sensor 180a or the current sensor 180b toward one of the sides 12a of the cooling jacket 12 in the transverse direction shown in FIG. 13 and to cross the side 12a. That is, while the main surfaces of the plurality of second alternating-current bus bars 804a to 804f face each other, the second alternating-current bus bars 804a to 804f are formed to cross the side 12a.

As a result, a plurality of plate-like alternating-current bus bars can be protruded to the outside from a shorter side of the cooling jacket 12 without enlarging the entire apparatus. The protrusion of the plurality of alternating-current bus bars from one side of the cooling jacket 12 facilitates wiring outside of the electrical converter 200 and improves the productivity.

As shown in FIG. 13, the holding member 803 made of a resin holds and insulates the first alternating-current bus bar 802a to 802f, the current sensors 180a to 180b, and the second alternating-current bus bars 804a to 804f.

By this holding member 803, the second alternating-current bus bars 804a to 804f improve insulation between the cooling jacket 12 and the housing 119 made of metal. The holding member 803 thermally or directly comes in touch with the cooling jacket 12, and the heat transmitted from the transmission 118 to the second alternating-current bus bars 804a to 804f can be released to the cooling jacket 12, so that the reliability of the current sensors 180a to 180b can be improved.

As shown in FIG. 13, the holding member 803 includes supporting members 807a and supporting members 807b for instructing the driver circuit board 22 shown in FIG. 4. A plurality of supporting members 807a are arranged, and the supporting members 807a are lined up along one of the sides of the cooling jacket 12 in the longitudinal direction. A plurality of supporting members 807b are arranged, and the supporting members 807b are lined up along the other side of the cooling jacket 12 in the longitudinal direction. Screw holes for fixing the driver circuit board 22 are formed at tip sections of the supporting members 807a and the supporting members 807b.

The holding member 803 further includes a protrusion 806a and a protrusion 806b extending upward from the parts where the current sensor 180a and the current sensor 180b are arranged. The protrusion 806a and the protrusion 806b are formed to penetrate through the current sensor 180a and the current sensor 180b, respectively. As shown in FIG. 14, the current sensor 180a and the current sensor 180b include signal lines 182a and signal lines 182b extending in the direction of the arrangement of the driver circuit board 22. The signal lines 182a and the signal lines 182b are bonded with the wiring pattern of the driver circuit board 22 by soldering. In the present embodiment, the holding member 803, the supporting members 807a to 807b, and the protrusions 806a to 806b are integrally formed by a resin.

As a result, the holding member 803 has a function of positioning the current sensor 180 and the driver circuit board 22, so that assembly and soldering connection work between the signal lines 182a and the driver circuit board 22 is facilitated. By arranging the mechanism for holding the current sensor 180 and the driver circuit board 22 on the holding member 803, the number of parts in the entire electrical converter can be reduced.

Since the electrical converter 200 of the present embodiment is fixed to the housing 119 storing the transmission 118, the electrical converter 200 is significantly influenced by the vibration from the transmission 118. Therefore, the holding member 803 includes a supporting member 808 for instructing near the center section of the driver circuit board 22, so that the influence of the vibration transmitted to the driver circuit board 22 is reduced. The holding member 803 is fixed to the cooling jacket 12 by screws.

Further, the holding member 803 includes a bracket 809 for fixing one of the ends of the auxiliary machine power module 350. As shown in FIG. 4, the auxiliary machine power module 350 is disposed on the protrusion 407 to fix the other end of the auxiliary machine power module 350 to the protrusion 407. This reduces the influence of the vibration transmitted to the auxiliary machine power module 350, and the number of parts for the fixation can be reduced.

Figure 15:
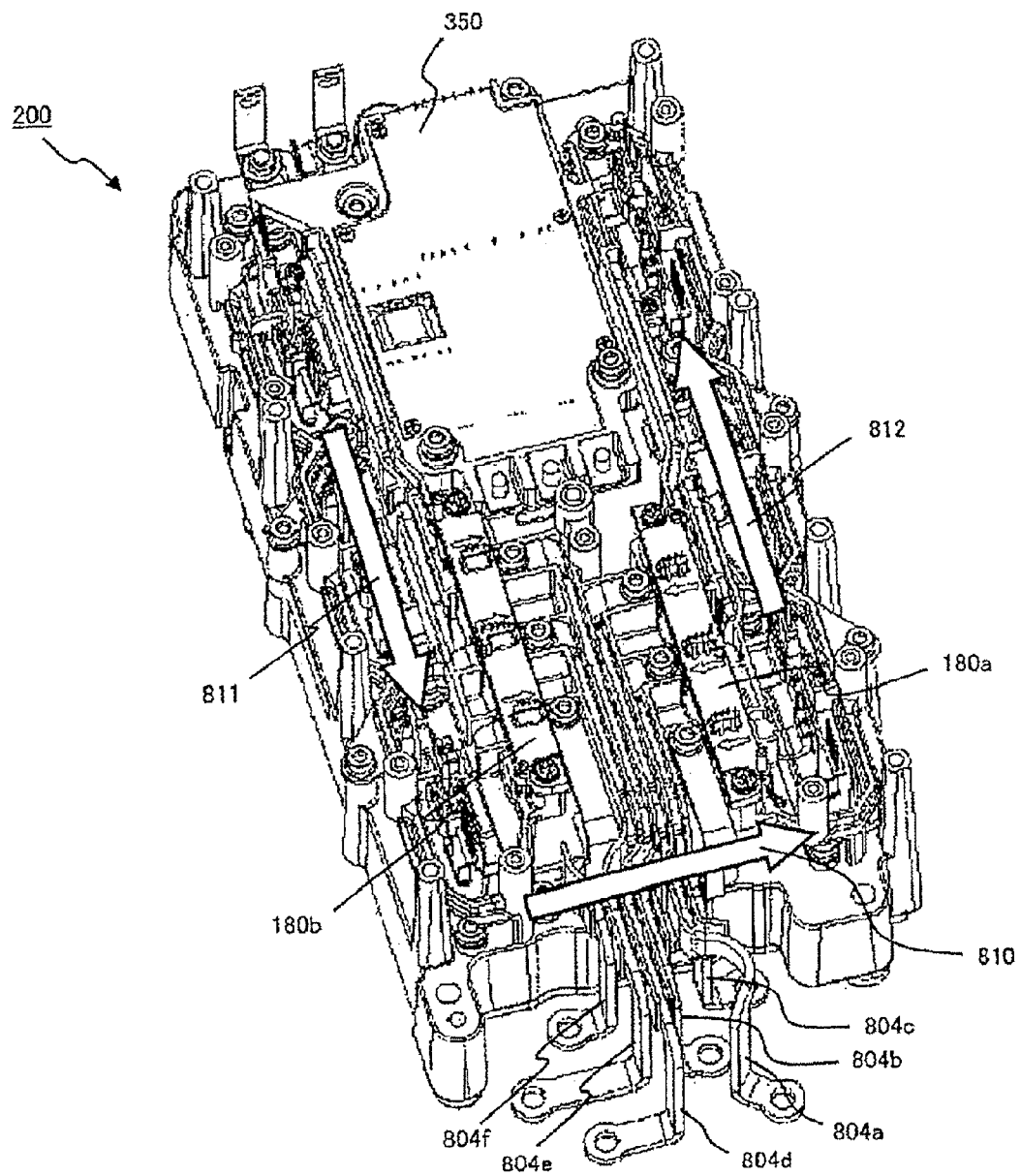
FIG. 15 is an external perspective view of the cooling jacket on which the power module, the capacitor module, the bus bar module, and an auxiliary machine power module are assembled.

FIG. 15 is an external perspective view of the cooling jacket 12 on which the power module, the capacitor module, the bus bar module 800, and the auxiliary machine power module 350 are assembled.

The current sensor 180 may be broken if heated over the heat resistant temperature of about 100° C. Particularly, the temperature of use environment is significantly high in an on-board electrical converter, and it is important to protect the current sensor 180 from the heat. Particularly, the electrical converter 200 according to the present embodiment is mounted on the transmission 118, so that it is important to protect the electrical converter 200 from the heat generated from the transmission 118.

Therefore, in the present embodiment, the current sensor 180a and the current sensor 180b are arranged on the opposite side of the transmission 118 across the cooling jacket 12. As a result, the heat generated by the transmission 118 is not easily transmitted to the current sensor, and the increase in the temperature of the current sensor can be reduced. The second alternating-current bus bars 804a to 804f are formed to cross a flow direction 810 of the refrigerant flowing through the third channel 19c shown in FIG. 5. The current sensor 180a and the current sensor 180b are arranged closer to the alternating-current terminal 321 of the power module than to the sections of the second alternating-current bus bars 804a to 804f crossing the third channel section 19c. As a result, the second alternating-current bus bars 804a to 804f are indirectly cooled by the refrigerant, and the heat transmitted from the alternating-current bus bars to the current sensors and further to the semiconductor chips in the power module can be reduced, so that the reliability improves.

A flow direction 811 shown in FIG. 15 indicates a flow direction of the refrigerant flowing through the fourth channel 19d shown in FIG. 5. Similarly, a flow direction 812 indicates a flow direction of the refrigerant flowing through the second channel 19b shown in FIG. 5. When the current sensor 180a and the current sensor 180b according to the present embodiment are projected from above the electrical converter 200, the projected sections of the current sensor 180a and the current sensor 180b are surrounded by the projected section of the channel 19. This arrangement can further protect the current sensors from the heat from the transmission 118.

Figure 16:
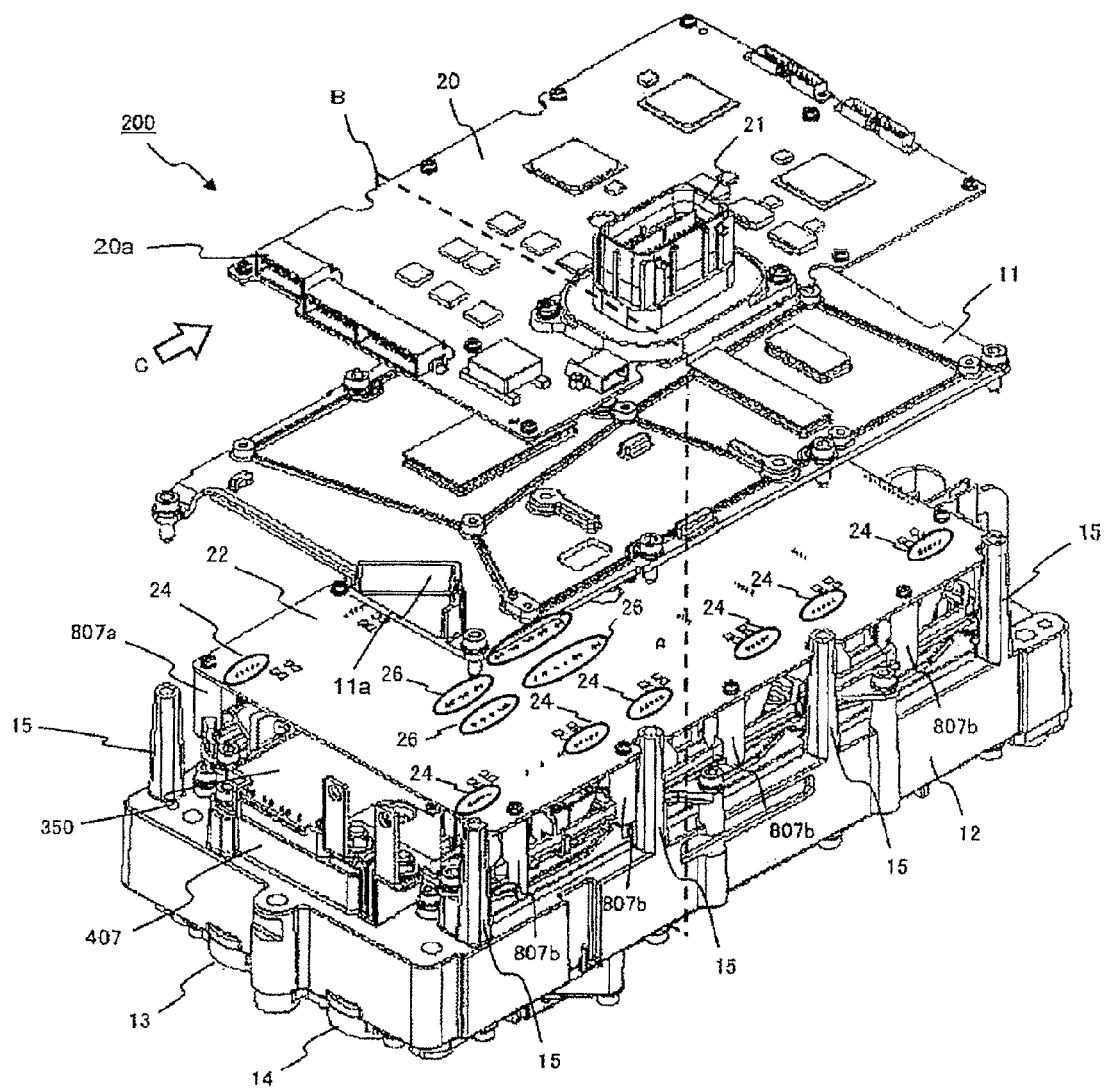
FIG. 16 is a split perspective view of the electrical converter in which a control circuit board and a metal base plate are separated.

FIG. 16 is a split perspective view of the electrical converter 200 in which the control circuit board 20 and the metal base plate 11 are separated.

The current sensor 180 is disposed above the capacitor module 500 as shown in FIG. 15. The driver circuit board 22 is disposed above the current sensor 180 and supported by the supporting members 807a and 807b disposed on the bus bar module 800 shown in FIG. 13. The metal base plate 11 is disposed above the driver circuit board 22 and supported by a plurality of supporting members 15 rising from the cooling jacket 12. The control circuit board 20 is disposed above the metal base plate 11 and fixed to the metal base plate 11.

The current sensor 180, the driver circuit board 22, and the control circuit board 20 are lined up in layers in the height direction, and the control circuit board 20 is arranged at a location farthest from the high-current power modules 300 and 301, which can prevent the switching noise and the like from entering. Further, the metal base plate 11 is electrically connected to the cooling jacket 12 electrically connected to the ground. By this metal base plate 11, the noise entering the control circuit board 20 from the driver circuit board 22 is reduced.

As shown in FIG. 3, since the battery negative electrode-side connection terminal section 510 and the battery positive electrode-side connection terminal section 512 are arranged to face the bottom surface of the case 10, the battery negative electrode-side connection terminal section 510 and the battery positive electrode-side connection terminal section 512 are arranged across the control circuit board 20, and thus an electromagnetic coupling is formed. As a result, the switching noise enters the control circuit board 20 and propagates to the harness linked to a control connector 20a, so that the harness may serve as an antenna, and the radiated noise may increase. In addition, a noise current may enter the control circuit board 20, and malfunction may occur.

Figure 18:
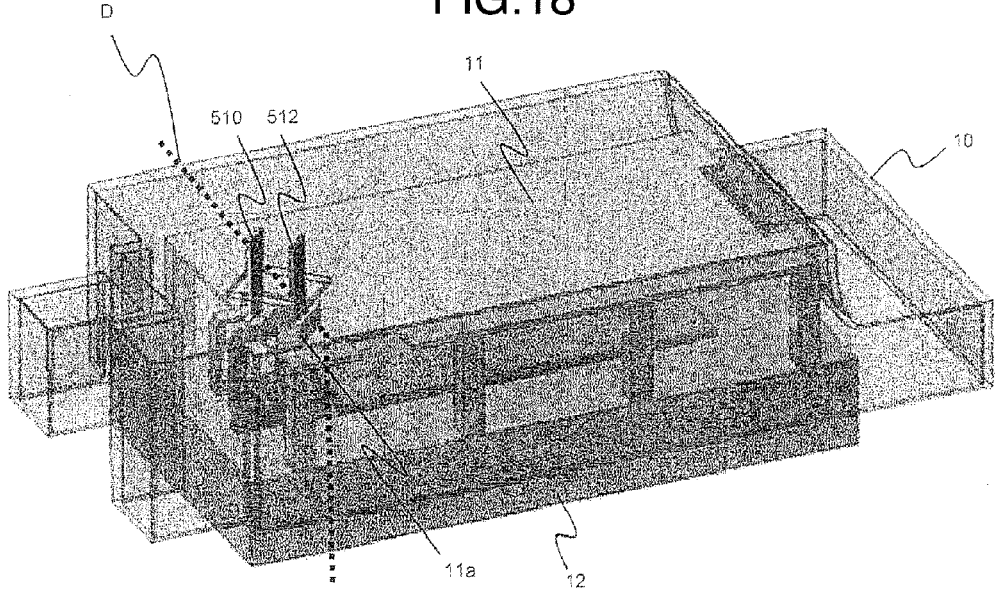
FIG. 18 is a diagram showing an electrical converter according to a first embodiment of the present invention.

FIG. 18 is a diagram showing an electrical converter according to an embodiment of the present invention.

Figure 19:
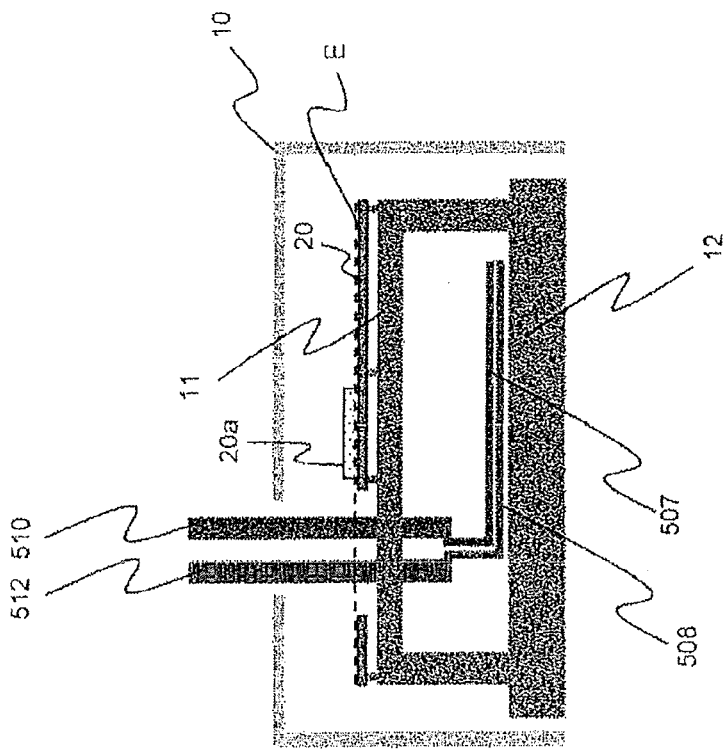
[FIG. 19](a) is a diagram showing an analysis model when walls are formed near a direct-current connection terminal section, and (b) is a diagram showing an analysis model when the walls are not formed.
Figure 19:
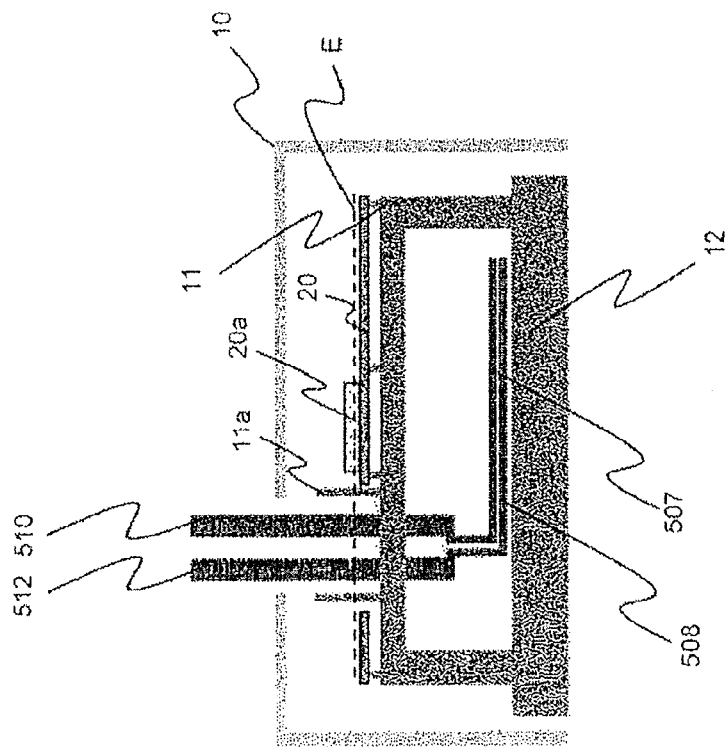

FIG. 19 shows a cross-sectional view when the electrical converter shown in FIG. 18 is cut at a surface D.

FIG. 19(a) is a diagram showing an analysis model when walls are formed near the direct-current connection terminal section, while FIG. 19(b) is a diagram showing an analysis model when the walls are not formed.

In the embodiment of the present invention disclosed in FIG. 19(a), in an electrical converter that supplies power from the upper surface of the case 10, walls 11a that are portions of the base plate 11 separating the spaces between the battery negative electrode-side connection terminal section 510, the battery positive electrode-side connection terminal section 512 and the control circuit board 20 are formed between the battery negative electrode-side connection terminal section 510, the battery positive electrode-side connection terminal section 512 and the control circuit board 20.

The walls 11a are formed by bending portions of the base plate 11 arranged in a plane between the cooling jacket 12 and the control circuit board 20. In FIG. 19(a), the walls 11a are conductor plates formed by metal, and the walls 11a are arranged in a substantially perpendicular direction relative to the base plate 11, the control circuit board 20, and the like.

As shown in FIG. 19(a), the conductor plates are arranged in the spaces between the battery negative electrode-side connection terminal section 510, the battery positive electrode-side connection terminal section 512 and the control circuit board 20, so that the noise propagated to the control circuit board 20 caused by coupling between the battery negative electrode-side connection terminal section 510 and the battery positive electrode-side connection terminal section 512 can be reduced.

In the electrical converter provided with the walls 11a, the control connector 20a can be arranged closer to the battery negative electrode-side connection terminal section 510 and the battery positive electrode-side connection terminal section 512 than in the electrical converter without the walls 11a, so that the space between the battery negative electrode-side connection terminal section 510 and the battery positive electrode-side connection terminal section 512 can be reduced, and this is advantageous in that the miniaturization of the electrical converter can be realized.

Further, forming the walls 11a by curving portions of the base plate 11 is advantageous in that the assembly is possible without extra assembly work.

The walls 11a may not be an integrated type formed by curving portions of the base plate 11. For example, the base plate 11 formed on a plane substantially parallel to the control circuit board 20 and walls formed in a direction substantially perpendicular to the control circuit board 20 may be biographically connected and assembled as separate members. In this case, walls with high electromagnetic shielding effect can be installed, while the base plate 11 remains to be easily processed.

On the other hand, FIG. 19(b) is a model diagram of an electrical converter without the walls. In this case, members for shielding noise are not arranged in the spaces between the battery negative electrode-side connection terminal section 510, the battery positive electrode-side connection terminal section 512 and the control circuit board 20, so that the noise from the battery negative electrode-side connection terminal section 510 and the battery positive electrode-side connection terminal section 512 is propagated to the control circuit board 20 without being cut off.

FIG. 20(a) is a diagram showing an analysis result with shields, while FIG. 20(b) is a diagram showing an analysis result without shields.

FIG. 20(a) indicates an analysis result of a field strength distribution when the electrical converter with the walls shown in FIG. 19(a) is cut at an E surface. FIG. 20(b) is a diagram showing an analysis result of the field strength distribution when the electrical converter without the walls shown in FIG. 19(b) is cut at the E surface.

Figure 20:
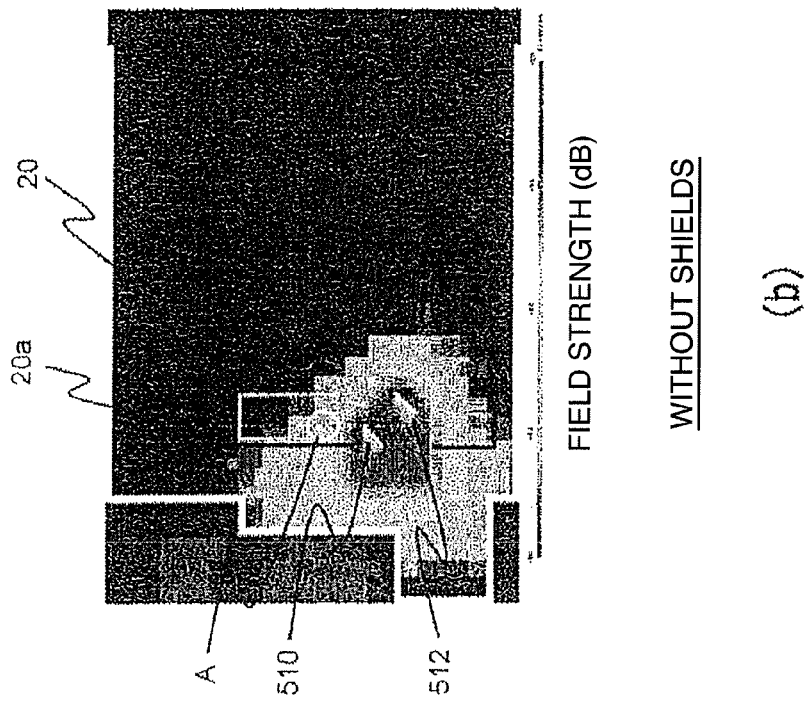
[FIG. 20](a) is a diagram showing an analysis result with shields, and (b) is a diagram showing an analysis result without shields.
Figure 20:
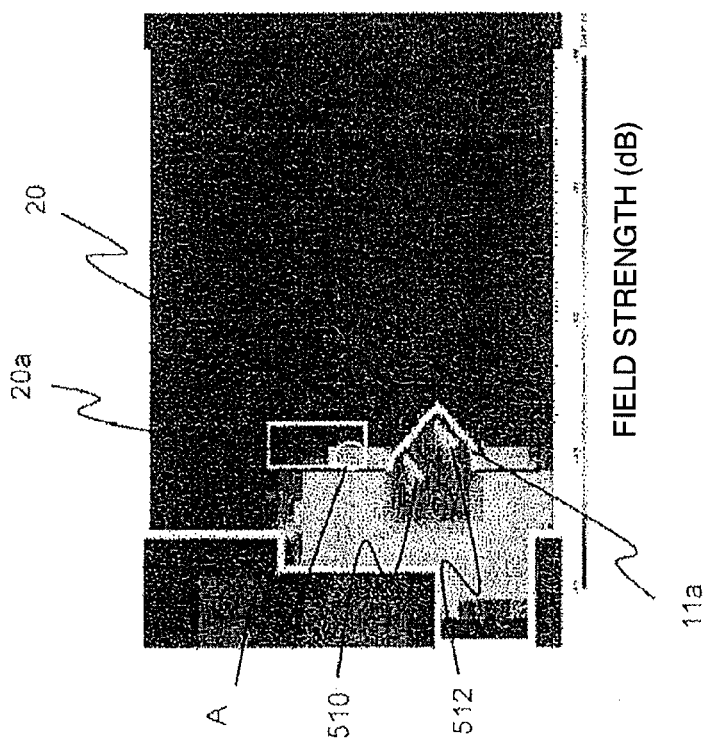

The field strength distribution in FIG. 20 is analyzed under conditions that the frequency of the noise generated by the propagation of the switching noise of the power semiconductor elements (IGBT 328, IGBT 330, diode 156, and diode 166) through the battery negative electrode-side connection terminal section 510 and the battery positive electrode-side connection terminal section 512 (direct-current connection terminal section) is set to 10 MHz and that the maximum value is normalized to 0 dB. In this case, the switching elements are switched at several kHz, and harmonic components at several MHz are propagated from the direct-current connection terminal section to the control circuit board 20 and the like by electromagnetic coupling. Therefore, the frequency of the noise generated by the direct-current connection terminal section is determined according to the carrier frequency of the drive signal output by the driver circuit board 22 to the IGBT 328, etc.

When the analysis results are compared, it can be recognized that the field strength in the control connector 20a on the metal base plate 11 at an A point of FIG. 20(a) indicates an electromagnetic field shielding effect of about −20 dB compared to FIG. 20(b). As a result, the formation of the conductor plates (walls 11a) in the spaces between the direct-current terminal sections, which include the battery negative electrode-side connection terminal section 510 and the battery positive electrode-side connection terminal section 512, and the control circuit boards 20 can reduce the influence of the noise from the battery negative electrode-side connection terminal section 510 and the battery positive electrode-side connection terminal section 512 to the control circuit board 20. When the influence of about the same level of noise is permitted, the control circuit board 20 (control connector 20a) can be installed closer to the battery negative electrode-side connection terminal section 510 and the battery positive electrode-side connection terminal section 512, compared to the case without the walls.

The gap between the walls 11a which are formed as portions of the base plate 11 and the case 10 may be filled with a conductive rubber. As a result, the noise propagated from the battery negative electrode-side connection terminal section 510 and the battery positive electrode-side connection terminal section 512 can be further prevented, and the electromagnetic shielding effect increases, and the noise leaked to the control circuit board 20 can be reduced. The rubber can also reduce the vibration from the case to the walls caused by connection to the case 10.

In the control circuit board 20, a circuit, such as a voltage detection circuit, that uses high voltage in the control circuit board can be mounted closest to the walls 11a made of the base plate 11. This can prevent malfunction in the control circuit caused by noise.

Figure 24:
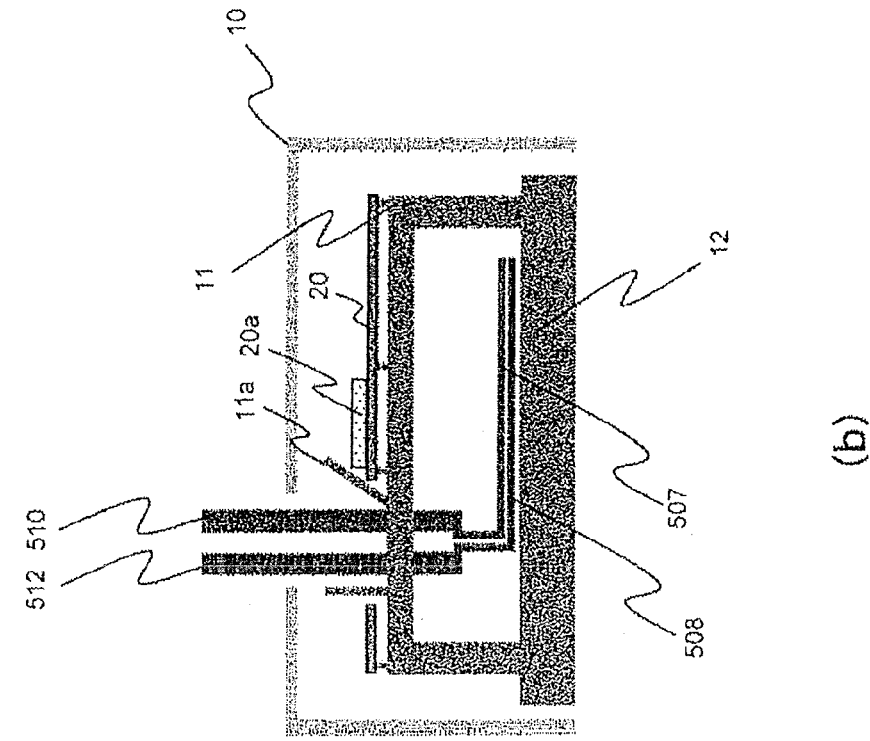
[FIG. 24](a) and (b) are diagram showing an example of a cross-sectional view of an electrical converter according to the present embodiment.
Figure 24:
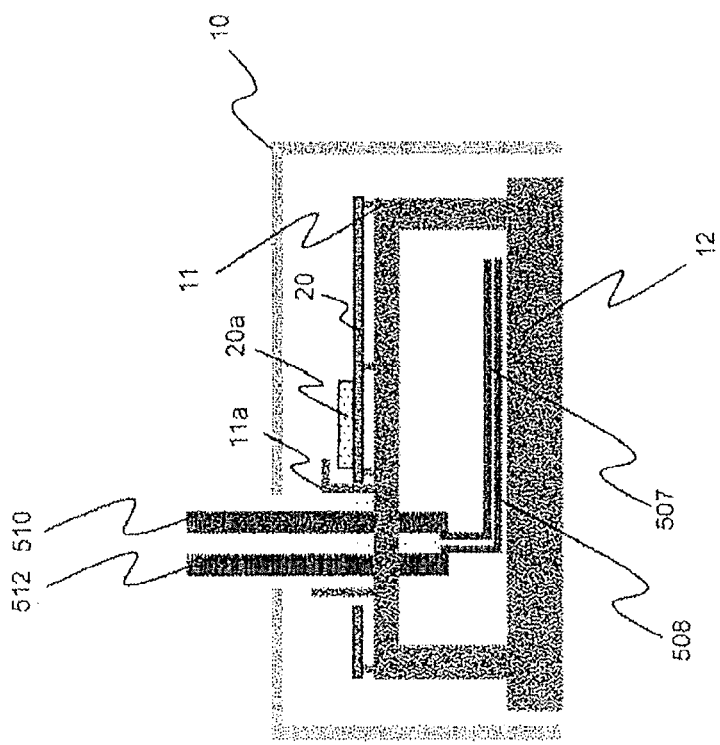
Figure 25:
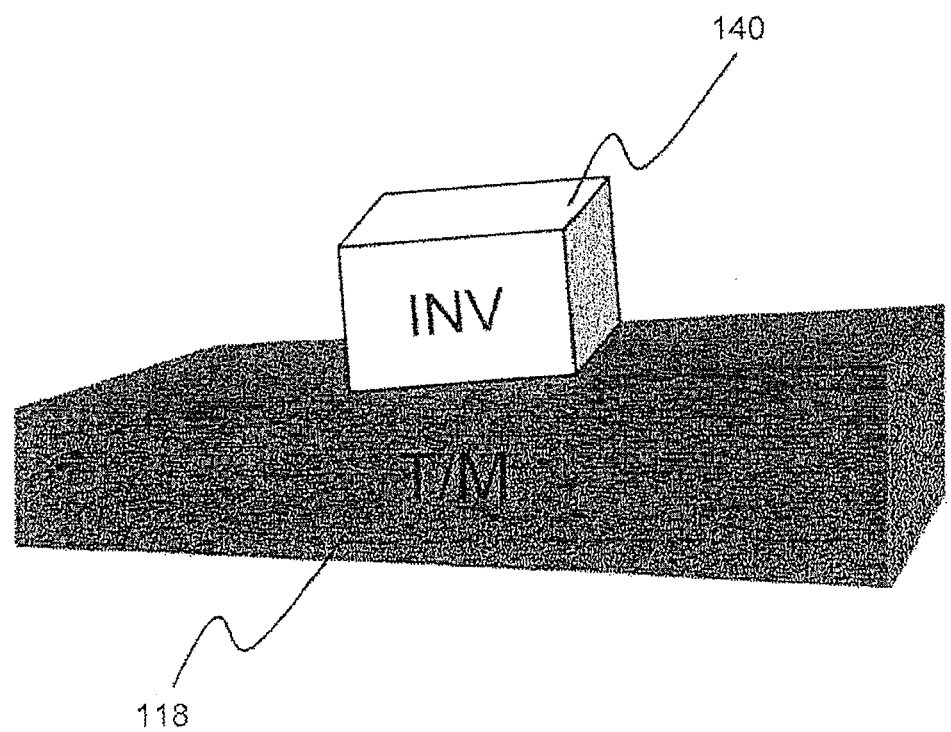
FIG. 25 is a diagram for describing an installation location of an electrical converter according to the present embodiment.

FIGS. 24(a) and 24(b) are diagrams showing an example of cross-sectional views of an electrical converter according to the present embodiment. Since the strength of the electromagnetic coupling is determined depending on the facing area and the distance, the wall 11a may be bent to cover the control connector 20a as shown in FIG. 24(a). Also, the wall 11a may be tilted toward the control connector 20a as shown in FIG. 24(b). This can increase the distance between the battery negative electrode-side connection terminal section 510, the battery positive electrode-side connection terminal section 512 and the control connector 20a in terms of the electromagnetic coupling, and the noise coupled to the control connector 20a can be reduced.

Figure 21:
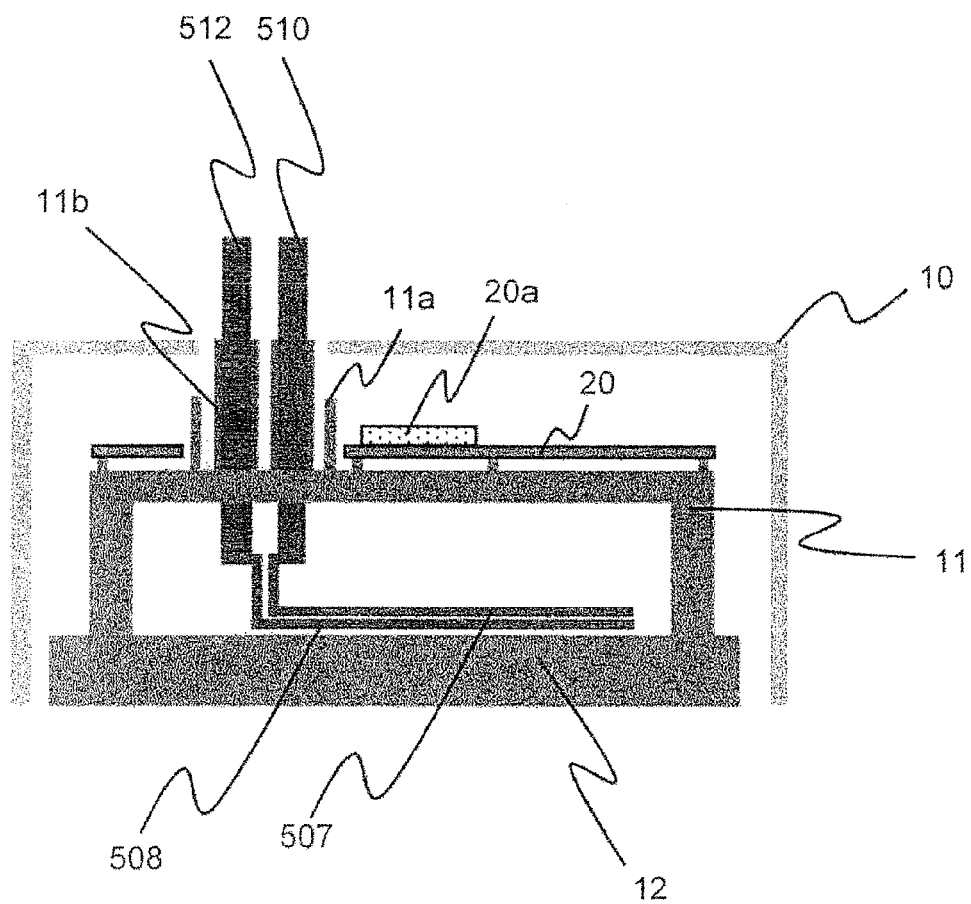
FIG. 21 is a diagram showing an example of a cross-sectional view of an electrical converter according to a second embodiment of the present invention.

FIG. 21 is a diagram showing an example of a cross-sectional view of an electrical converter according to a second embodiment of the present invention.

The electrical converter according to the second embodiment of the present invention is characterized in that a general radio wave absorbent 11b made of carbon, ferrite, or the like is used to surround the battery negative electrode-side connection terminal section 510 and the battery positive electrode-side connection terminal section 512. As a result, induced current induced from the battery negative electrode-side connection terminal section 510 and the battery positive electrode-side connection terminal section 512 to the control connector 20a can be reduced, and secondary radiation from the walls 11a can be prevented.

Figure 22:
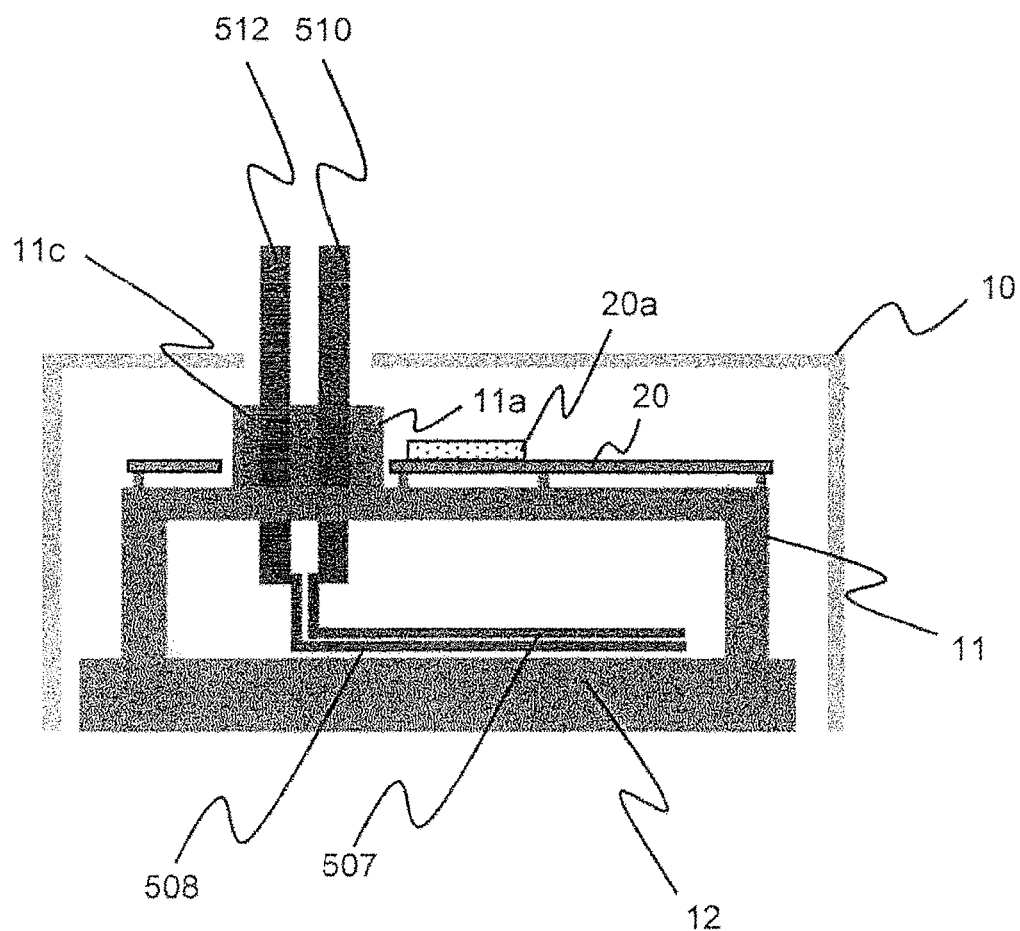
FIG. 22 is a diagram showing an example of a cross-sectional view of an electrical converter according to a third embodiment of the present invention.

FIG. 22 is a diagram showing an example of a cross-sectional view of an electrical converter according to a third embodiment of the present invention.

The electrical converter according to the second embodiment of the present invention is characterized in that a dielectric material 11c with a higher dielectric constant than air is inserted between the battery negative electrode-side connection terminal section 510, the battery positive electrode-side connection terminal section 512 and the wall 11a electrically connected to the base plate 11. The battery (direct current) negative electrode-side connection terminal section 510, the battery (direct current) positive electrode-side connection terminal section 512 and the wall 11a electrically connected to the base plate 11 are closely arranged, and by inserting the high-dielectric material 11c to the spaces, the noise current that entered the battery negative electrode-side connection terminal section 510 and the battery positive electrode-side connection terminal section 512 can be discharged to the ground and can form bypass capacitors that reduce the loop path of the noise (521a and 521b of FIG. 2). Since the noise reduction effect increases with an increase in the dielectric constant of the dielectric material, it is desirable to use a higher dielectric material. The bypass capacitors formed between the battery negative electrode-side connection terminal section 510, the battery positive electrode-side connection terminal section 512 and the base plate 11 are connected in parallel with the bypass capacitors 521a and 521b. This can reduce or eliminate the capacities of the bypass capacitors 521a and 521b. Since the capacities of the bypass capacitors formed between the battery negative electrode-side connection terminal section 510, the battery positive electrode-side connection terminal section 512 and the base plate 11 are determined by the facing area, it is desirable that the height of the inserted high-dielectric material 11c is about the same height as the walls 11a along the battery negative electrode-side connection terminal section 510 and the battery positive electrode-side connection terminal section 512.

Figure 23:
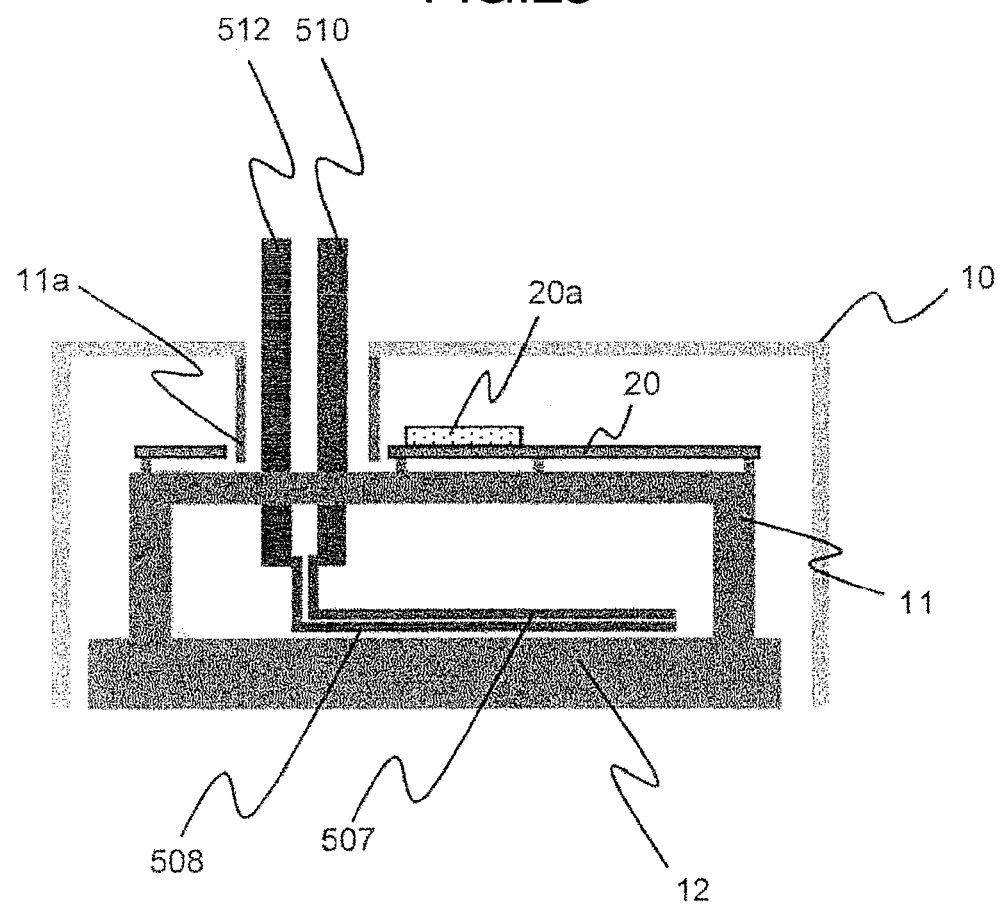
FIG. 23 is a diagram showing a cross-sectional view of an electrical converter according to a fourth embodiment of the present invention.

FIG. 23 is a diagram showing an example of a cross-sectional view of an electrical converter according to a fourth embodiment of the present invention.

The electrical converter according to the second embodiment of the present invention is characterized in that the walls 11a are formed as portions of the case 10.

When the case 10 is grounded from above the base plate 11, the walls 11a may be formed as portions of the case 10 as shown in FIG. 23. As a result, the inductance of the walls 11a up to the ground is reduced, and since the walls 11a are installed at points where the potential is stable, the noise reduction effect can be increased.

Since, in the present embodiment, the targets to be cooled by the refrigerant flowing through the channel 19 are mainly the drive power modules 300 and 301, the power modules 300 and 301 are stored in the channel 19 and cooled by direct contact with the refrigerant. Meanwhile, cooling of the auxiliary machine power module 350 is also demanded, although not so much as the drive power modules.

Therefore, in the present embodiment, a heat dissipating surface of the auxiliary machine power module 350 formed by a metal base is formed to face the inlet piping 13 and the outlet piping 14 through the channel 19. Particularly, since the protrusion 407 for fixing the auxiliary machine power module 350 is formed above the inlet piping 13, the refrigerant flowing from below collides with the inner wall of the protrusion 407, and the heat can be efficiently removed from the auxiliary machine power module 350. Further, a space linked to the channel 19 is formed inside of the protrusion 407. This space inside of the protrusion 407 increases the depth of the channel 19 near the inlet piping 13 and the outlet piping 14, so that liquid is accumulated in the space inside of the protrusion 407. This liquid accumulation can efficiently cool the auxiliary machine power module 350.

If a wiring connector is used to electrically connect the current sensor 180 and the driver circuit board 22, it may induce increased connection steps and a connection error.

Therefore, as shown in FIG. 16, the driver circuit board 22 of the present embodiment is provided with first holes 24 and second holes 26 through which the driver circuit board 22 penetrates. The signal terminals 325U and the signal terminals 325L of the power module 300 are inserted to the first holes 24, and the signal terminals 325U and the signal terminals 325L are bonded by the wiring pattern of the driver circuit board 22 and by soldering. Further, the signal lines 182 of the current sensors 180 are inserted to the second holes 26, and the signal lines 182 are bonded by the wiring pattern of the driver circuit board 22 and by soldering. The solder bonding is performed from the surface side of the driver circuit board 22 on the opposite side of the surface facing the cooling jacket 12.

As a result, the signal lines can be connected without using the wiring connector, and the productivity can be improved. The signal terminals 325 of the power module 300 and the signal lines 182 of the current sensors 180 are bonded by soldering from the same direction, and the productivity can be further improved. The driver circuit board 22 is provided with the first holes 24 through which the signal terminals 325 penetrate and provided with the second holes 26 through which the signal lines 182 penetrate, so that the probability of connection error can be reduced.

The driver circuit board 22 of the present embodiment is provided with a drive circuit (not shown) such as a driver IC chip on the side facing the cooling jacket 12. As a result, the transmission of the heat of the solder bonding to the driver IC chip or the like is suppressed, and damage to the driver IC chip or the like by the solder bonding is prevented. Since a tall part such as a transformer mounted on the driver circuit board 22 is disposed in the space between the capacitor module 500 and the driver circuit board 22, the height of the entire electrical converter 200 can be reduced.

Figure 17:
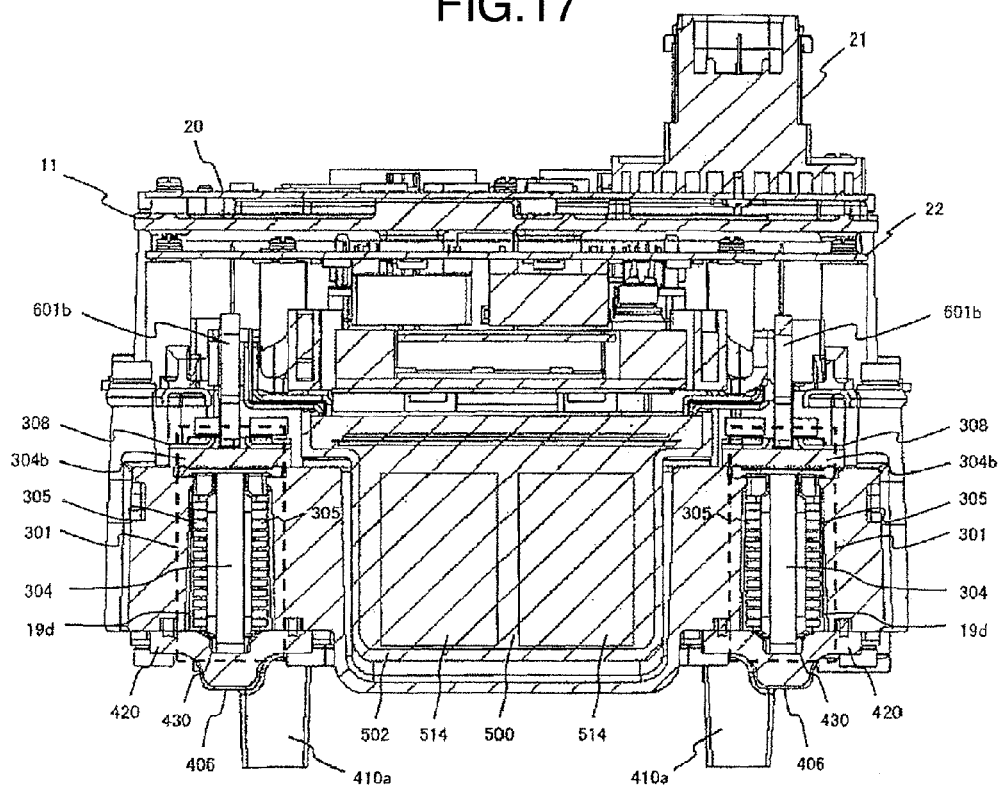
FIG. 17 is a cross-sectional view from a C direction of the electrical converter cut at a B surface of FIG. 16.

FIG. 17 is a cross-sectional view from a C direction of the electrical converter 200 cut at a B surface of FIG. 16.

The flange 304B disposed on the module case 304 is pressed against the cooling jacket 12 by the flange 515a or the flange 515b disposed on the capacitor case 502. That is, the weight of the capacitor case 502 itself storing the capacitor cells 514 can be used to press the module case 304 against the cooling jacket 12 to improve the airtightness of the channel 19.

The refrigerant in the channel 19 needs to flow into the area provided with the fin 305 to improve the cooling efficiency of the power module 300. The module case 304 is not provided with the fin 305 at the bottom of the module case 304 to ensure the space of the bent section 304A. So the lower cover 420 is formed so that the bottom of the module case 304 is fitted to a concave section 430 formed on the lower cover 420. This can prevent the refrigerant from flowing into the space without the cooling fin.

As shown in FIG. 17, the power module 300, the capacitor module 500, and the power module 301 are aligned across the arrangement direction of the control circuit board 20, the driver circuit board 22, and the transmission 118. Particularly, the power module 300, the capacitor module 500, and the power module 301 are aligned in the lowest layer in the electrical converter 200. As a result, the height of the entire electrical converter 200 can be reduced, and the influence of the vibration from the transmission 118 can be reduced.

REFERENCE SIGNS LIST

10 ... case, 11 ... base plate, 11a ... wall, 12 ... cooling jacket, 20 ... control circuit board, 20a ... control connector, 110 ... hybrid electric car (HEV), 120 ... engine, 156, 166 ... diodes, 192, 194 ... motor generators, 300a to 300c, 301a to 301c ... power modules, 328, 330 ... IGBTs, 510 ... battery negative electrode-side connection terminal section, 512 ... battery positive electrode-side connection terminal section

The invention claimed is:

1. An electrical converter comprising:
 a case;
 a power module mounted on the case and provided with a plurality of power semiconductor elements;
 a metal plate mounted to the power module and fixed to the case;
 a control circuit board disposed on the metal plate which controls the power semiconductor elements;
 direct-current input terminals electrically connected to a battery;
 a transmission or a motor is provided at a bottom of the electrical converter, and
 a metal top cover that accommodates a connector which connects the battery and the direct-current input terminals is provided at a top of the electrical converter, wherein
 a portion of the metal plate is curved toward the metal top cover, and the portion of the curved metal plate is arranged in a space between the control circuit board and the direct-current input terminals.

2. The electrical converter according to claim 1, wherein the curved metal plate comprises a first section arranged on a plane over the control circuit board and a second section arranged substantially perpendicular to a surface of the first section.

3. The electrical converter according to claim 2, wherein the direct-current input terminals comprise a battery negative electrode-side connection terminal section and a battery positive electrode-side connection terminal section, and
 each of the direct-current input terminals is covered by a radio wave absorbent.

4. The electrical converter according to claim 2, wherein a dielectric material is inserted between the direct-current input terminals and the second section of the metal plate.

5. The electrical converter according to claim 2, wherein a portion of the case is arranged in the space between the control circuit board and the direct-current input terminal.

6. The electrical converter according to claim 2, wherein the metal plate is provided with a third section connected to the second section so as to cover the connector.

7. The electrical converter according to claim 6, wherein the third section is formed on a surface parallel to a surface of the control circuit board so as to cover the connector.

* * * * *